(12) United States Patent
Kagami et al.

(10) Patent No.: US 6,377,418 B1
(45) Date of Patent: Apr. 23, 2002

(54) DIGITAL FILTER, SERVO CONTROL UNIT, AND DISK DRIVE

(75) Inventors: Naoyuki Kagami, Fujisawa; Akira Tokizono, Fujisawa, both of (JP); Hien Dang, Nanuet, NY (US); Arun Sharma, New Rochelle, NY (US); Sri M. Sri-Jayantha, Ossining, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/148,846

(22) Filed: Sep. 3, 1998

(30) Foreign Application Priority Data

Sep. 26, 1997 (JP) .............................................. 9-262035

(51) Int. Cl.[7] .............................................. G11B 5/596
(52) U.S. Cl. ........................ 360/78.14; 360/39; 360/75
(58) Field of Search ................................ 360/65, 77.02, 360/78.14; 375/11, 14, 229; 318/560, 561; 708/319, 425, 316, 303, 301, 321–323; 364/724.19, 724.01

(56) References Cited

U.S. PATENT DOCUMENTS

| | | | | |
|---|---|---|---|---|
| 3,522,546 A | * | 8/1970 | Jackson et al. ............. 708/306 |
| 3,798,560 A | * | 3/1974 | Taylor ........................ 708/323 |
| 5,057,945 A | * | 10/1991 | Shimada et al. ............... 360/22 |
| 5,155,422 A | * | 10/1992 | Sidman et al. ............... 318/560 |
| 5,245,262 A | * | 9/1993 | Moody et al. ............... 318/560 |
| 5,245,565 A | * | 9/1993 | Petersen et al. .......... 360/65 X |
| 5,325,247 A | | 6/1994 | Ehlich et al. ............. 360/78.09 |
| 5,335,121 A | * | 8/1994 | Bombeeck .................... 360/65 |
| 5,369,345 A | * | 11/1994 | Phan et al. .................. 318/561 |
| 5,479,362 A | * | 12/1995 | Sun et al. ............... 364/724.01 |
| 5,561,568 A | | 10/1996 | Kisaka ..................... 360/78.04 |
| 5,608,586 A | * | 3/1997 | Sri-Jayantha et al. ..... 360/65 X |
| 5,650,954 A | * | 7/1997 | Minuhin ..................... 364/825 |
| 5,694,422 A | * | 12/1997 | Kaku et al. .................. 375/229 |
| 5,856,934 A | * | 1/1999 | Nakajima et al. ..... 364/724.011 |

FOREIGN PATENT DOCUMENTS

| | | | | |
|---|---|---|---|---|
| JP | 57-003267 A | 1/1982 | ........... G11B/21/08 |
| JP | 59-047826 A | 3/1984 | ........... H03H/17/02 |
| JP | 63-278409 A | 11/1988 | ........... H03H/17/02 |
| JP | 05128552 A | 5/1993 | ........... G11B/7/085 |
| JP | 06096540 A | 4/1994 | ........... G11B/21/10 |
| JP | 06325517 A | 11/1994 | ........... G11B/21/10 |
| JP | 08235799 A | 9/1996 | ........... G11B/21/10 |

* cited by examiner

Primary Examiner—David Hudspeth
Assistant Examiner—K. Wong
(74) Attorney, Agent, or Firm—Noreen A. Krall; Esther E. Klein

(57) ABSTRACT

The present invention provides a digital filter which is capable of preventing filter outputs from being discontinuous when a filter characteristic is changed. Initially, a servo assistant (SA) computes parameters for computing servo data, and based on the computed parameters, the SA judges an operating mode. If the mode has been changed, the SA will advance in processing. Next, the parameters of a filter are changed in correspondence with the judged operating mode, and the initial values of the interior variables of the filter are set to appropriate values.

17 Claims, 17 Drawing Sheets

| MPES | SPES | MPES+SPES | MPES:SPES | CUR_POS COMPUTATION EQUATION | CUR_CYL CYLID EVEN | COMPUTATION EQUATION CYLID ODD |
|---|---|---|---|---|---|---|
| > 80 | ≥ 80 | > 100 | > | SPES−80 | CYLID+1 | CYLID+0 |
| > 80 | > 80 | > 100 | ≤ | −MPES | CYLID+1 | CYLID+0 |
| ≤ 80 | > 80 | > 100 | < | −MPES | CYLID−1 | CYLID+0 |
| < 80 | > 80 | ≤ 100 | < | −SPES+80 | CYLID−1 | CYLID+0 |
| < 80 | ≤ 80 | < 100 | < | −SPES−80 | CYLID+0 | CYLID+1 |
| < 80 | < 80 | < 100 | ≥ | MPES | CYLID+0 | CYLID+1 |
| ≥ 80 | < 80 | < 100 | > | MPES | CYLID+0 | CYLID−1 |
| > 80 | < 80 | ≥ 100 | > | SPES+80 | CYLID+0 | CYLID−1 | ic disk X1 which is employed in a hard-disk drive (HDD) as a data storage medium, as shown in FIG. 2, concentric circular recording tracks X2 are formed. On the recording track X2, servo areas X3 are provided at predetermined angle intervals, and a servo pattern, an ID number, and the like are recorded on the servo areas X3 at a constant angular velocity. Between adjacent servo areas X3, there is provided a data area X4 on which data sectors X5 are recorded at a constant angular velocity. Also, in an HDD such as this, the data area X4 are segmented into some zones in the radial direction thereof, and the number of data sectors X5 corresponding to the radial position is recorded on each data zone, thereby making recording densities uniform.

DIGITAL FILTER, SERVO CONTROL UNIT, AND DISK DRIVE

BACKGROUND OF THE INVENTION

1. Field of the Invention

The present invention relates to a digital filter, a servo control unit, and a disk drive, and more particularly to a reduction in noise as filter characteristics are changed.

2. Description of Related Art

On the recording side of a magnetic disk X1 which is employed in a hard-disk drive (HDD) as a data storage medium, as shown in FIG. 2, concentric circular recording tracks X2 are formed. On the recording track X2, servo areas X3 are provided at predetermined angle intervals, and a servo pattern, an ID number, and the like are recorded on the servo areas X3 at a constant angular velocity. Between adjacent servo areas X3, there is provided a data area X4 on which data sectors X5 are recorded at a constant angular velocity. Also, in an HDD such as this, the data area X4 are segmented into some zones in the radial direction thereof, and the number of data sectors X5 corresponding to the radial position is recorded on each data zone, thereby making recording densities uniform.

In the aforementioned conventional HDD, if a sector is specified and recording/regeneration is instructed, the head X6 will be moved to a target track on which the specified sector for recording/regeneration has been recorded (seek control). After the head X6 has arrived at the target track, the head position is adjusted so that the head X6 follows the target track (following control).

In the servo control such as a seek control and a following control, a head arm X7 is moved based on the error between the current position of the head X6 and the position of a target track, by a hard disk controller (HDC) X9 provided in the HDD.

More specifically, the servo sector X3 records disk servo patterns (WEDGE-A, WEDGE-B, WEDGE-C, and WEDGE-D) and a cylinder ID number (CYLID), as shown in FIG. 3, and if the head X6 passes over the servo sector X3, the outputs of the servo patterns and ID number regenerated by the head X6 will be supplied to the HDC X9. If these regenerated outputs are supplied, the HDC X9 will compute the current position of the head X6 based on these outputs and will compute position error between the computed current position and the position of a target track. Based on the position error, the HDC X9 computes data (DACOUT value) for driving a voice coil motor (VCM) X8 which causes the head arm X7 to move.

In the seek control the HDC X9 computes the difference (position error) between the current position of the head X6 and the position of a target sector and then performs control based on this position error.

When a target track is specified, the HDC X9 first executes a control for accelerating the head X6 toward the target sector. Then, if the moving speed of the head X6 reaches a predetermined speed, the HDC X9 will execute a control for moving the head X6 at a constant speed. Finally, if the head X6 arrives near the target sector, the HDC X9 will execute a settling control for decelerating the head X6.

If the head X6 arrives at the target track, the HDC X9 will switch the settling control to a track following control for causing the head X6 to follow the target track. The control switching is performed by changing an arithmetic parameter which computes a DACOUT value.

The DACOUT value, obtained in the aforementioned way, contains the resonance frequency component of the actuator system comprising head arm X7. Therefore, if the VCM X8 is directly driven based on such a DACOUT value during the seek operation, there are cases where the head position control will become unstable. For this reason, for example, as shown in U.S. Pat. No. 5,325,247, the resonance frequency component of the DACOUT value is reduced to stabilize the servo control by employing a notch filter.

Also, if a low-pass characteristic is flat during the track following operation, there will be cases where control will not stabilize due to disk eccentricity and disturbance. For this reason, in background art, as shown for example in U.S. Pat. No. 5,608,586, the servo characteristic has a peak on the low frequency side so that control stability can be obtained.

In order to realize such control, the HDD is provided with a plurality of filters whose characteristics are different from one another. The filters are selected according to operating modes, or the operation of each filter is controlled.

However, if a plurality of filters are provided as previously described, the cost of the HDD will be increased.

For the above described reasons, a digital filter has been employed to change the filter characteristic by a parameter change. In the case where the aforementioned digital filter is employed however, when a parameter is changed, even if the filtering process attempts to continue by employing the immediately prior value of an interior variable as it is, an accurate value cannot be computed because the parameter has been changed, and the filter outputs will be discontinuous. Also, in the case where an interior variable is cleared when a parameter is changed, similarly an accurate value cannot be computed and therefore filter outputs will be discontinuous.

SUMMARY OF THE INVENTION

The present invention has been made in view of problems such as those described above, and accordingly, the object of the invention is to provide a digital filter, a servo control unit, and a disk drive which are capable of preventing filter outputs from becoming discontinuous when the filter characteristic is changed.

A digital filter according to the present invention comprises a first filter and initial value setting means. The first filter includes means for delaying an external filter input by at least a unit time, means for setting a filter coefficient by weighting at least either one or the other of the external filter input and the delaying means, and means for adding at least two of the external filter input, an output of the delaying means, and an output of the setting means to compute filter output. The initial value setting means sets the output of the delaying means, based on at least one of the filter input and the filter output before changing the filter coefficient, when the filter coefficient set by the setting means is changed.

The servo control unit according to the present invention comprises: servo arithmetic means for computing control output based on an external control input and band limiting means for setting a band limit to the control output computed by the servo arithmetic means. The band limiting means has the same structure as the digital filter of the present invention.

DETAILED DESCRIPTION OF THE PREFERRED EMBODIMENT

Figure 1:
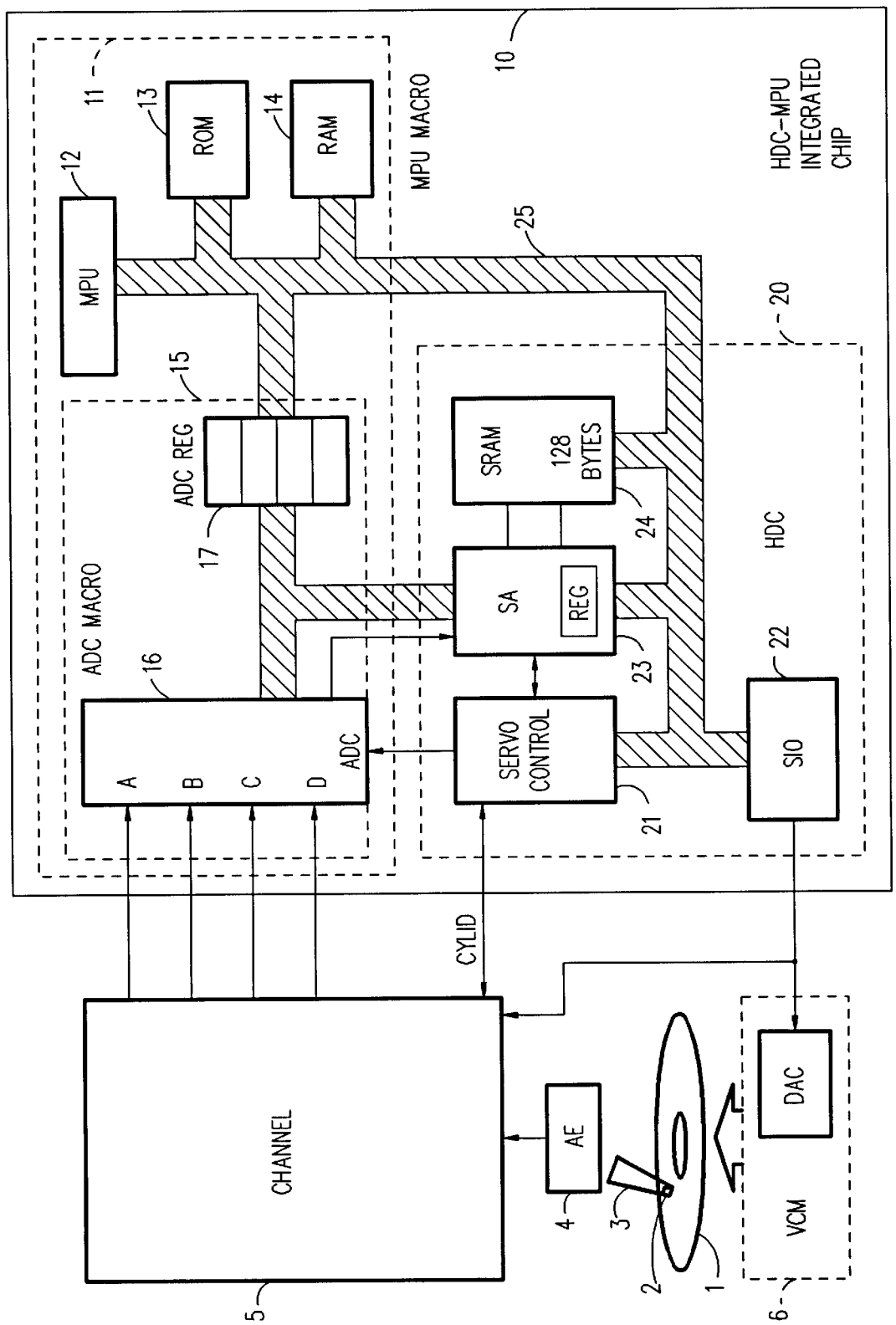
FIG. 1 is a block diagram showing the constitution of a disk drive according to an embodiment of the present invention.

FIG. 1 is a block diagram showing the constitution of a disk drive according to a first embodiment of the present invention.

This disk drive is equipped with a magnetic disk 1, a head 2 for performing recording/regeneration on the magnetic disk 1, a head arm 3 with the head 2 attached thereto, a head amplifier (AE) 4 disposed near the head 2 for amplifying a signal regenerated from the head 2, a channel section 5 for extracting servo patterns and a cylinder ID number (CYLID) from the regenerated signal supplied via the AE 4 and for performing conversion of a coding system, an HDC 20 for performing formation of a servo signal, an HDC-MPU integrated chip 10 for performing control of recording/regeneration with respect to the magnetic disk 1, and a VCM driver section 6 for driving a voice coil motor (VCM) 6 which in turn moves the head arm 3.

The HDC-MPU integrated chip 10 is equipped with the hard disk controller (HDC) 20 for performing formation of a servo signal and an MPU macro block (MPU macro) 11 for controlling an operation of the entire disk drive. The MPU macro 11 and the HDC 20 are integrally constituted, for example, as a single semiconductor device.

Figure 2:
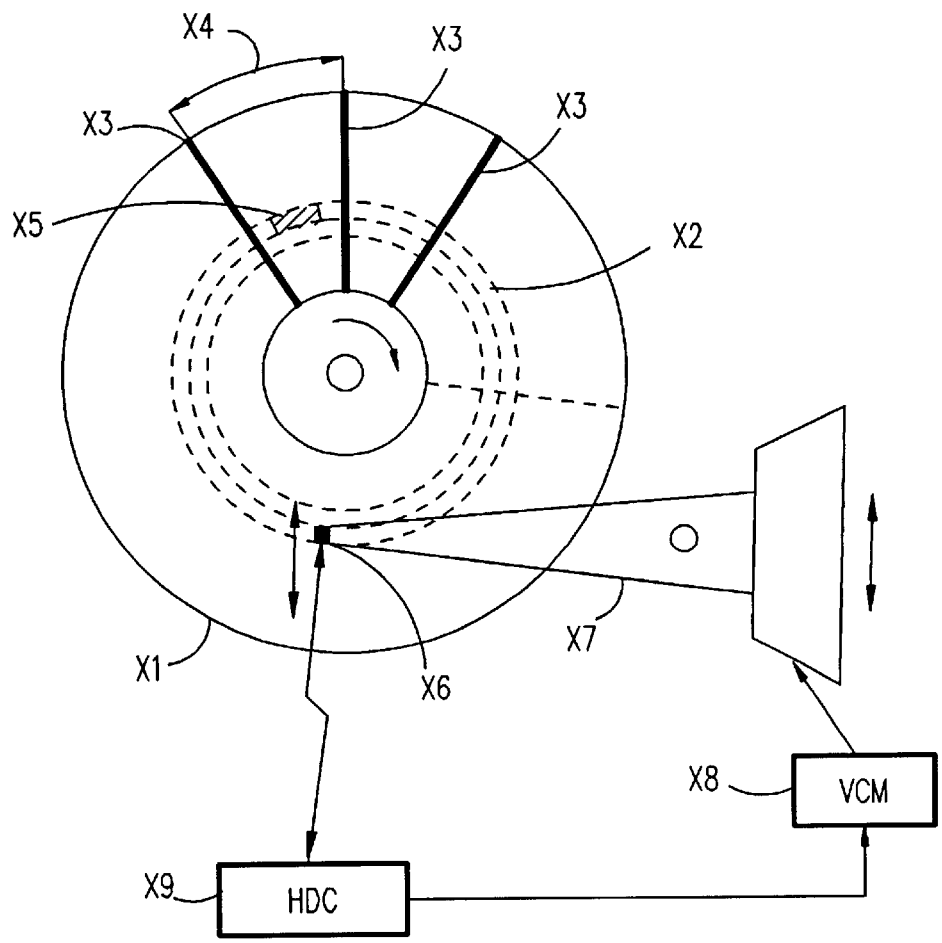
FIG. 2 is a block diagram showing the constitution of a conventional disk drive.

On the recording side of the magnetic disk 1, circular tracks X2 with a predetermined width are concentrically formed in the same way as the magnetic disk X1 shown in FIG. 2. Also, the recording side is provided with servo areas at intervals of a predetermined angle. This servo area records a servo pattern X3. On the data area X4 between adjacent servo patterns X3 on each track X2, data sectors X5 are recorded. Note that the data area X4 may be segmented into some zones in the radial direction thereof and the number of data sectors X5 corresponding to the radial position may be recorded on each data zone to make recording densities uniform.

Figure 3:
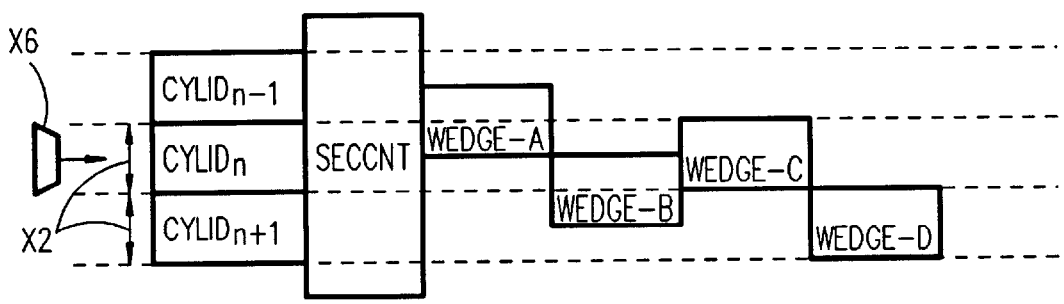
FIG. 3 is a diagram showing an example of the format of a servo sector used in the conventional disk drive.

On each servo sector X3, as with FIG. 3, a cylinder ID number (CYLID) representing a track number, a physical sector number (SECCNT) representing a servo pattern number, and a burst pattern (WEDGE-A, WEDGE-B, WEDGE-C, and WEDGE-D) for a tracking (following) control are encoded and recorded by respective coding methods suitable for recording/regeneration.

The cylinder ID number CYLID is recorded with special notation called a gray number code. The gray number code is defined, unlike normal binary-coded notation, so that each time a value increases by 1, only a single point in a bit pattern changes. Therefore, even when the head X6 flies between the cylinder ID numbers CYLIDn and CYLIDn-1, either one or the other of the ID numbers is always obtained. The physical sector number SECCNT is a number for identifying each individual servo pattern. This number does not change even when the radial position varies, so it is recorded with binary-coded notation. The channel section 5 regenerates the cylinder ID number CYLID and the physical sector number SECCNT by the decoding methods corresponding to the respective methods for coding the CYLID and SECCNT, and supplies the regenerated numbers to the MPU macro 11.

The burst patterns (WEDGE-A, WEDGE-B, WEDGE-C, and WEDGE-D) are magnetic patterns for removing the uncertainty of a cylinder ID number CYLID such as that described above, deciding over which track a head is positioned among adjacent tracks, and for detecting the detail position of the head on the decided track. The burst patterns, as shown in FIG. 3, are recorded so that the radial recorded positions of the burst patterns each having a width of a track pitch with two tracks as one cycle differ from each other by half the track pitch at a time. The channel section 5 supplies analog voltages A, B, C, and D corresponding to the regenerated levels of the servo patterns (WEDGE-A, WEDGE-B, WEDGE-C, and WEDGE-D) to the MPU macro 11.

The MPU macro 11 (referring back to FIG. 1) is equipped with an MPU 12, a read-only memory (ROM) 13 on which programs and data have been recorded, a random access memory (RAM) 14, and an analog/digital (AD) conversion macro block (ADC macro) 15. This ADC macro 15 is equipped with an analog/digital converter (ADC) 16 for performing an AD conversion and an ADC register (ADCREG) 17 for retaining the result of the AD conversion. The MPU 12 implements a control program recorded, for example, on the ROM 13, thereby implementing the input-output control of commands and data between it and an outside unit, the read/write control of data with respect to the magnetic disk 1, and so on. If the regenerated levels A, B, C, and D of the servo patterns are supplied from the channel section 5, the ADC 16 will convert the regenerated levels to digital signals in sequence. If the AD conversions are ended, the ADC 16 will supply the conversion results to the ADC register 17 and an AD conversion completion signal to the HDC 20.

The HDC 20 is equipped with a servo control section 21 for performing the occurrence of a control signal with respect to the channel section 5, the retrieval of servo patterns, and the generation of a cylinder ID number CYLID from the regenerated output of a gray number code. Furthermore, the HDC 20 is equipped with a serial I/O (SIO) 22 for performing a mutual conversion between parallel data and serial data, a hardware sequencer (hereinafter referred to as a "servo assist SA") 23 for computing servo data, based on the regenerated levels A, B, C, and D of the servo patterns stored in the ADC register 17, and a static RAM (SRAM) 24 for transmitting and receiving data between the SA 23 and the MPU 12.

The SIO 22 mutually converts parallel data which is supplied to the MPU 12 and serial data which is supplied to the channel section 5 or converts the parallel servo outputs (DACOUT) from the SA 23 or the MPU 12 to serial data. The serial data is supplied to a digital/analog conversion (DAC) section provided within the VCM driver section 6. Since the occurrence of the servo output and the occurrence of the input-output of data with respect to the channel section 5 are low, the disk drive of this embodiment shares the SIO 22, thereby reducing disk drive cost. Since the SIO 22 is shared, the SIO 22 performs conflict control between the processing of data between the MPU 12 and the channel section 5 and the processing of data which is supplied from the SA 23 or the MPU 12 to the DAC section of the VCM driver section 6.

The SRAM 24 has, for example, a capacity of 128 bytes (=16 bits×64 words), and is employed as an area for retaining various coefficients or performing a computation, in addition to data reception and transmission. In this constitution, while the ADC macro 15 incorporated in the MPU 12 has been employed for cost reduction, an AD converter may also be provided separately from the MPU 12 to achieve high-speed operation and high precision.

The SA 23, while the MPU 12 is operated by a program, is operated by a previously set hardware sequence. For this reason, while the SA 23 has particularly been specified for computation of servo control, it can be operated at high speed compared with the MPU 12. In addition, after a predetermined parameter has been set by the MPU 12, the SA 23 can be independently operated, and consequently, processing load to the MPU 12 is not increased so significantly.

The SA 23 is mounted as a portion of the HDC 20, which is in turn provided on the same chip as the MPU macro 11, as described above. For this reason, while the number of wires remain retained between the SA 23, the MPU 12, and the servo control section 21, the number of terminals for receiving or outputting a signal from or to an external unit can be reduced. Therefore, this arrangement can contribute to a reduction in the package size and a reduction in the device size.

Figure 4:
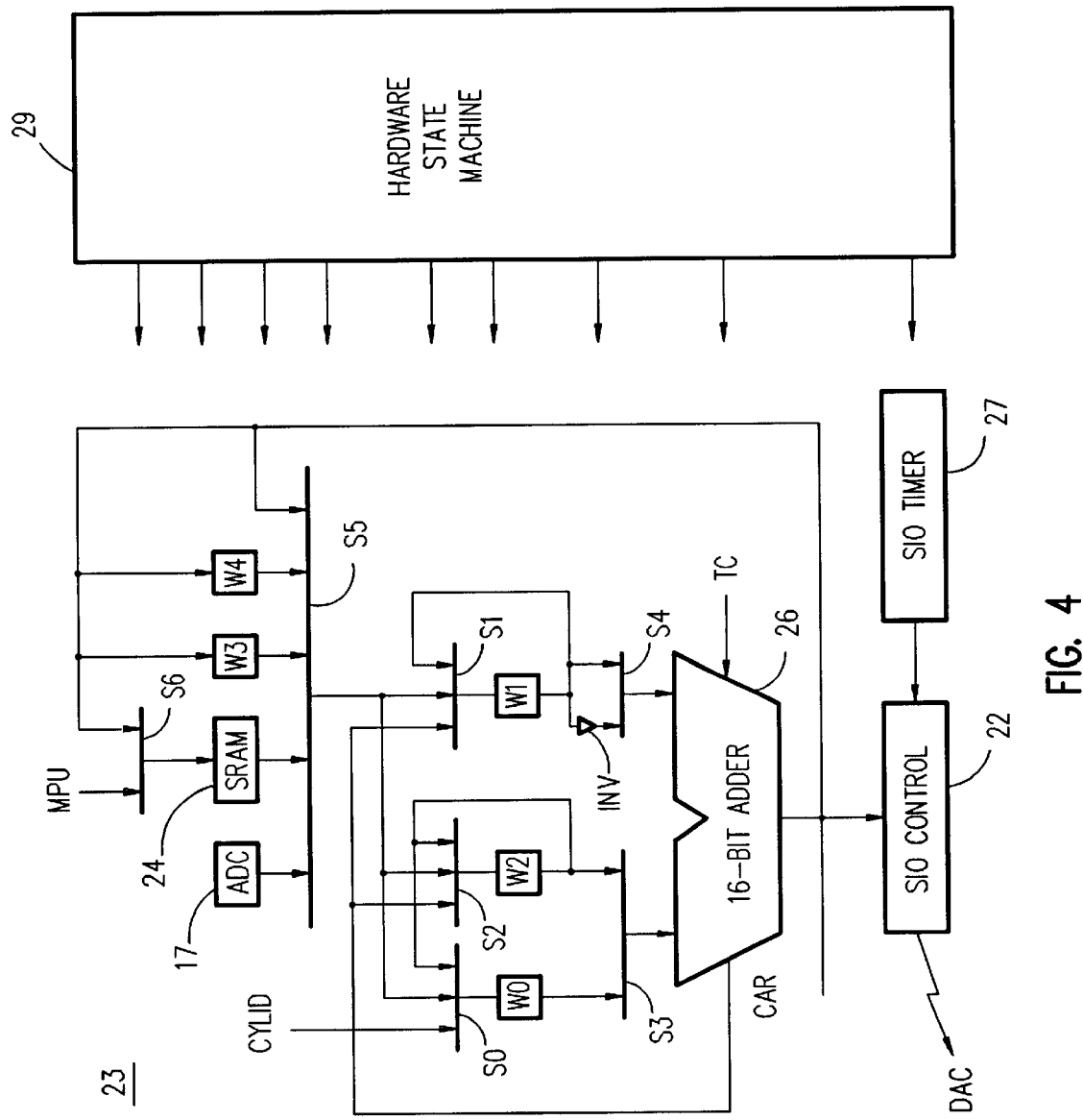
FIG. 4 is a block diagram showing the constitution of a hardware sequencer (SA) constituting the disk drive according to the embodiment of the present invention.

More specifically, the SA 23 is shown and described in FIG. 4. The SA 23 is equipped with registers W0 through W4 for retaining data temporarily, selectors S0 through S6 for performing data selection and also performing simple data processing such as data inversion and shift, a 16-bit adder (hereinafter referred to as simply an adder) 26 for performing addition of two 16-bit data, a SIO timer 27 for controlling the timing at which the SIO 22 outputs a signal, and a hardware state machine (SM) 29 for performing the entire control of the SA 23.

The control of setting data to the registers W0 through W4 and the control of the switching by the selectors S0 through S5 are performed according to a predetermined procedure by the hardware state machine 29.

The adder 26 is a general binary adder with an initial carry input (IC) and a carry output (CAR) and performs single addition, for example, W0=W0+W1 for 50 ns.

To the selector S5, the outputs of the ADC register 17 and SRAM 24 in FIG. 1 and the outputs of the registers W3 and W4 and adder 26 in FIG. 4 are supplied. The output of the selector S5 is supplied to the selectors S0, S1, and S2. The output of the adder 26 is supplied to the selector S6 and the registers W3 and W4.

The selector S6 selects both the data from the MPU 12 in FIG. 1 and the output of the adder 26 and supplies them to the SRAM 24, by the control from the state machine 29.

To the selector S0, the output of the selector S5, the cylinder ID number (CYLID) from the channel section 5 in FIG. 1, and the output of the register W2 are supplied. The output of the selector S0 is supplied to the register W0.

To the selector S1, the output of the selector S5, the carry output (CAR) of the adder 26, and the output of the register W1 are supplied. The output of the selector S1 is supplied to the register W1.

To the selector S2, the output of the selector S5, the carry output (CAR) of the adder 26, and the output of the register W2 are supplied. The output of the selector S2 is supplied to the register W2.

The outputs of the registers W0 and W2 are supplied to the selector S3. The selector S3 selects either one or the other of the outputs of the registers W0 and W2 according to the control from the state machine 29 and supplies the selected output to one input of the adder 26. Also, the output of the register W1 is supplied to the selector S1, inverter INV, and to the selector S4. The output of the inverter INV is input to the selector S4. The selector S4 selects either the output of the register W1 or the inverted output of the register W1 inverted by the inverter INV according to the control from the state machine 29, and supplies the selected output to the other input of the adder 26.

The output of the adder 26 is supplied to the SIO 22 shown in FIG. 1. The output of the SIO 22 is supplied in serial form to the DAC section of the VCM driver section 6 at the timing instructed by the SIO timer 27.

The SA 23, as shown in FIG. 4, consists of simple structure constituted by the adder 26, the registers W0 through W4, and the selectors S0 through S5, but the SA 23 can execute a complicated computation, such as a computation for servo control and a filter processing computation, if the state machine 29 controls computation, based on the instruction from the MPU 12.

The operation of the SA 23 will hereinafter be described with addition as an example.

Figure 5:
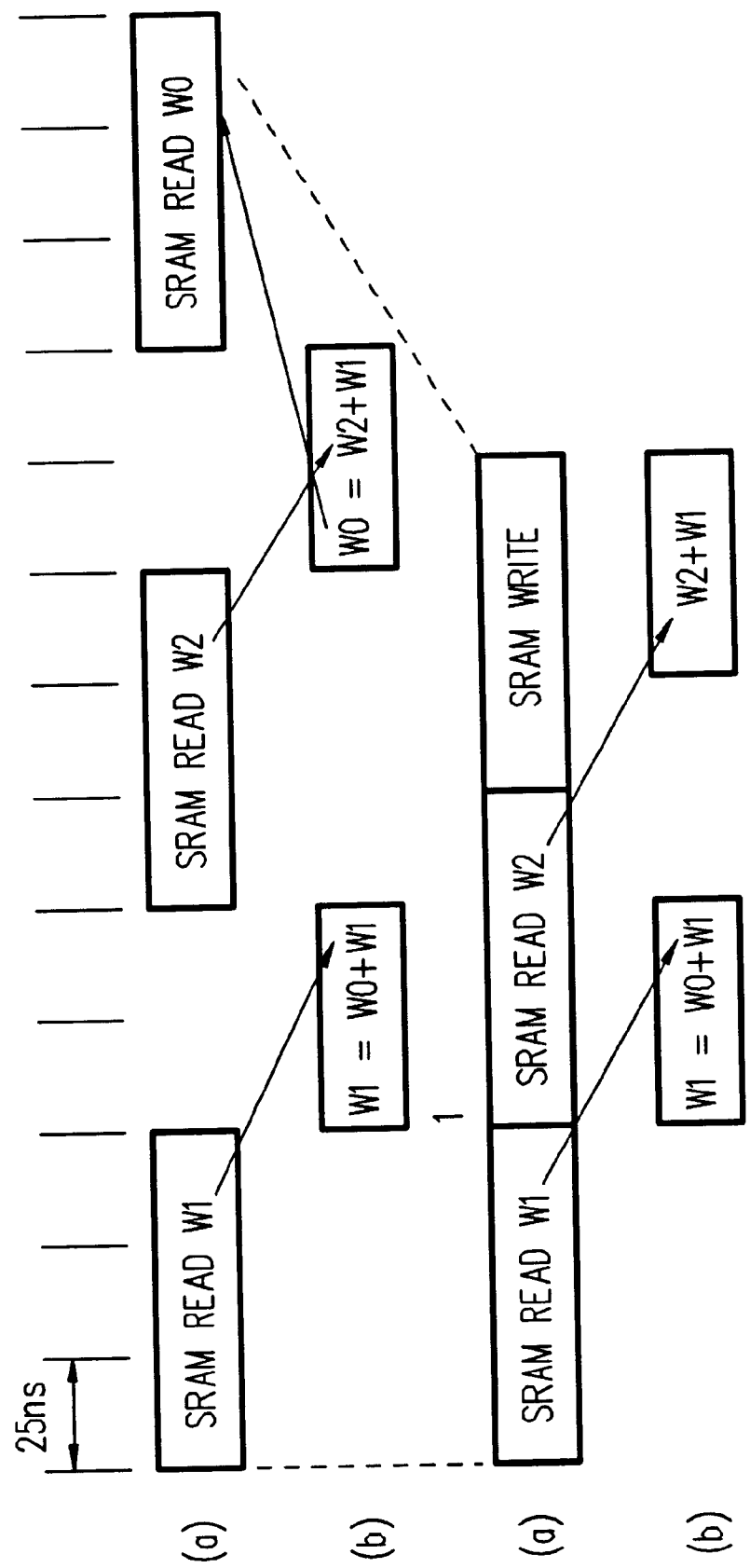
FIG. 5 is a diagram showing how an arithmetic process is performed by the SA.

In the case where the content of the SRAM 24 is set to the register W1, the state machine 29 supplies both an address on the SRAM 24 where the data to be set to the register W1 has been recorded and a read request to the SRAM 24. At the same time, the state machine 29 instructs the selector S5 to select the SRAM 24 and instructs the selector S1 to select the selector S5. In the selected state, if the setting of data to the register W1 is instructed, the data read from the SRAM 24 will be supplied and set to the register W1, as shown in FIG. 5(a).

In the case where addition, for example, the computation of W1=W0+W1 is performed, the state machine 29 first controls the selectors S0 and S4, thereby setting the values of W0 and W1. Then, the state machine 29 instructs the adder 26 to perform the computation. With this instruction, the value of W0+W1 is output from the adder 26. Finally, the state machine 29 controls the selectors S5 and S0 so that the output of the adder 26 is supplied to the register W1, and if the state machine 29 instructs the register W1 to store the supplied data, the computation result of W0+W1 will be stored in the register W1 (FIG. 5(b)).

In the case where the content of the register W0 is written to the SRAM 24, the state machine 29 instructs the selector S3 to select the register W0 and makes the output of the selector S4 and the initial carry input (IC) of the adder 26 zero. Therefore, the value of the register W0 appears on the output of the adder 26. At the same time, the state machine 29 supplies both an address on the SRAM 24 where the data of the register W0 is stored and a write request to the SRAM 24. Therefore, as shown in FIG. 5(a), the data retained on the register W0 is stored at the selected address on the SRAM 24.

For subtraction, multiplication, division, a computation for servo control, and filter processing, as with the aforementioned, the state machine 29 controls the operation of each portion, based on the instruction from the MPU 12, and thereby can realize the mathematical operations.

Note that since there is the possibility that the SRAM 24 will have access from the MPU 12, the SRAM 24 is provided with a conflict control mechanism which can cope with simultaneous access. For this reason, as shown in FIG. 5(a), single access to the SRAM 24 and conflict control require about 75 ns in all.

However, the adder 26 is empty while data is being read from the SRAM 24. For this reason, after the read operation of data from the SRAM 24 shown in FIG. 5(a) has been ended, if the state machine 29 instructs the adder 26 to perform a computation, as shown in FIG. 5(b), and if the state machine 29 performs the read control of data from the SRAM 24 with respect to a register at the same time, then access to the SRAM 24 and computation by the adder 26 can be performed at the same time.

Even during a write operation as well, access to the SRAM 24 and computation by the adder 26 can be performed in parallel by performing similar control. Furthermore, as shown in FIGS. 15(c) and (d), if the selection of an address on the SRAM 24 to which a computation result is written and the computation of W2+W1 are executed in parallel and if the computation result is written directly to the selected address on the SRAM 24 after the end of the computation, then even higher speed operation will be possible.

The SA 23, constructed as previously described, computes a position error signal (PES), based on the interrupt signal that is supplied from the servo control section 21 (after the channel section 5 has detected a servo pattern), the cylinder ID number CYLID extracted from the channel section 5, the four AD conversion completion notifications from the ADC 16, and based on the conversion result data (8 bits or 10 bits) from the ADC register 17.

If the head 2 passes over tracks constructed as described above, the regenerated outputs CYLID, SECCNT, WEDGE-A, WEDGE-B, WEDGE-C, and WEDGE-D will appear in this order on the output of the head 2. The regenerated levels A, B, C, and D of these burst patterns WEDGE-A, WEDGE-B, WEDGE-C, and WEDGE-D change in correspondence with the position of the head 2.

Figure 6:
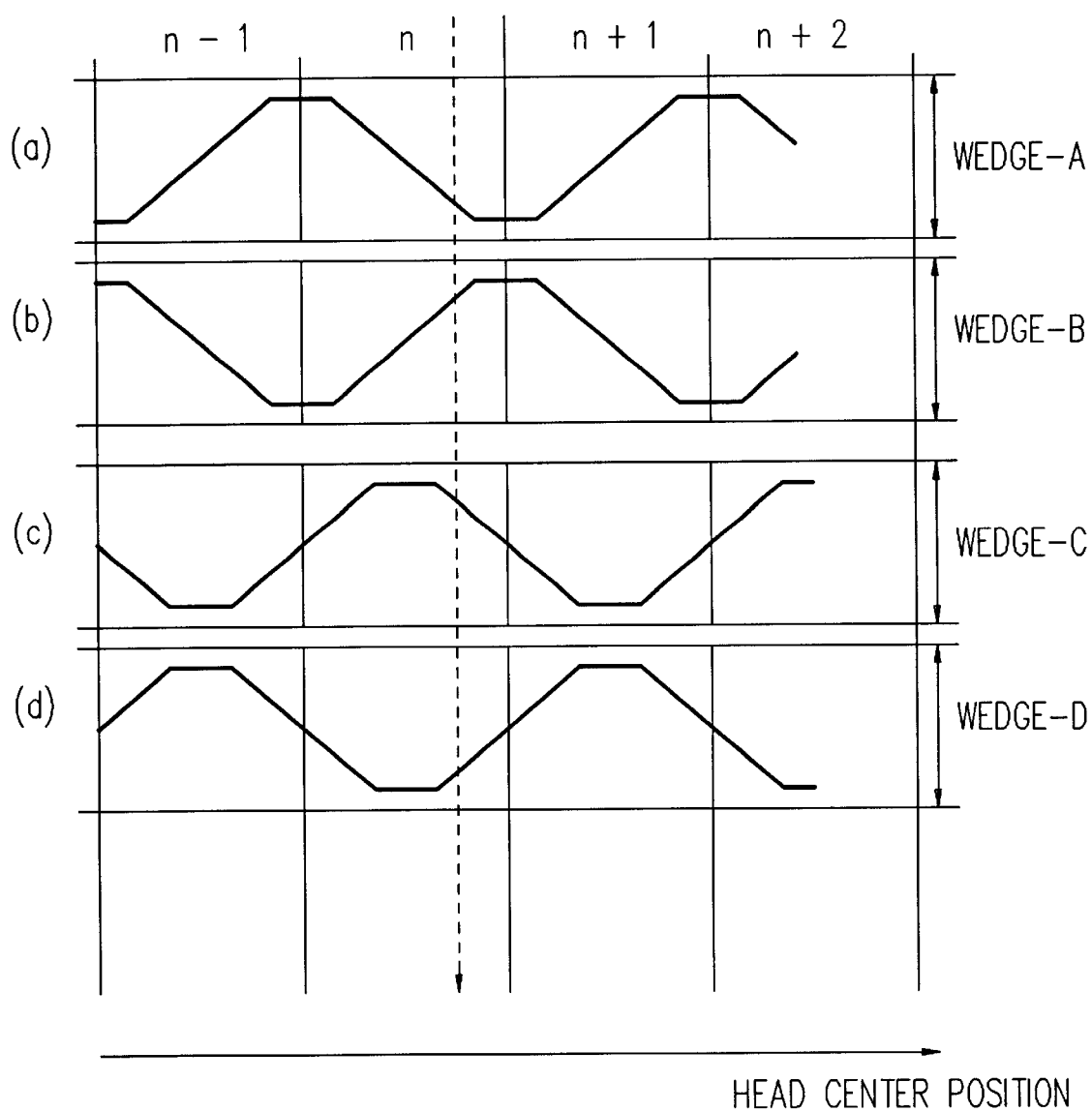
FIG. 6 is a diagram showing the relationship between the radial position of a magnetic head and the level of a regenerated servo pattern.

FIG. 6 shows a change in the regenerated level of each burst pattern in the case where the center position of the head X6 changes from one end of a track n−1 to one end of a track n+2. Each of the regenerated levels A, B, C, and D changes linearly in correspondence with the position of the head X6 when the head X6 is in a predetermined range. Also, A+B and C+D are nearly constant, respectively. For this reason, from the regenerated output levels of these burst patterns a position error signal (PES) can be detected. For this position error signal PES, there are two kinds: a master PES (MPES) employing regenerated levels A and B and a slave PES (SPES) employing regenerated levels C and D. The MPES and the SPES are obtained by the following equations:

Equation 1

$$MPES = \frac{A-B}{A+B}H + 80h = \frac{2A}{A+B}H + 80h - H \quad (1)$$

Equation 2

$$SPES = \frac{C-D}{C+D}H + 80h = \frac{2C}{C+D}H + 80h - H \quad (2)$$

where 00h≦A, B, C, and D≦FFh and H is the head coefficient (00h≦H≦7Fh, 7F and vicinity). The value areas of the master position error signal MPES and the slave position error signal SPES are both greater than 01h and less than FFh.

In the case where the magnetic head X6 passes over the center of a track n, A and B become equal to each other, so 2A/(A+B) becomes 1 and MPES becomes 80h. Also, in the case where the magnetic head X6 is positioned from the center of the track n in the downward direction in FIG. 3 and does not pass over WEDGE-A rather passes over only WEDGE-B, A becomes 0, so 2A/(A+B) becomes 0 and MPES becomes 0h. Conversely, in the case where the magnetic head X6 is positioned from the center of the track n in the upward direction in FIG. 3 and passes over only WEDGE-A but does not pass over WEDGE-B, B becomes 0, so 2A/(A+B) becomes 2 and MPES becomes FFh (or CYLID become 00h on a track n+1).

If the burst patterns (WEDGE-A, WEDGE-B, WEDGE-C, and WEDGE-D) are normal, A+B and C+D will be nearly constant and these values will be nearly equal to each other. Therefore, if the slave position error signal SPES is computed by the following equation, the burst pattern WEDGE-D will be rendered unnecessary and an area on which data is recorded can be widened.

Equation 3

$$SPES = \frac{2C}{C+D}H + 80h - H \qquad (3)$$

$$= \frac{2C}{A+B}\frac{A+B}{C+D}H + 80 - H$$

$$= \frac{2C}{A+B}HS + 80 - H$$

where 00h≦HS≦7Fh and HS is the head coefficient (7F and vicinity). When C/(A+B)>1, C/(A+B) is replaced with 1.

The value areas of the master position error signal MPES and the slave position error signal SPES are both greater than 01h and less than FFh, but when the values are small, stability is bad. For this reason, an intermediate value (for example, about 40h to C0h) is selected between the MPES and the SPES, and the current in-track position (CUR_POS) is computed. Also, from the values of MPES and SPES the cylinder ID number CYLID of the current track is decided and taken to be the current cylinder (CUR_CYL). The computations of the current in-track position (CUR_POS) and the current cylinder (CUR_CYL) are performed according to a table shown in FIG. 7.

Figures 7, 8:
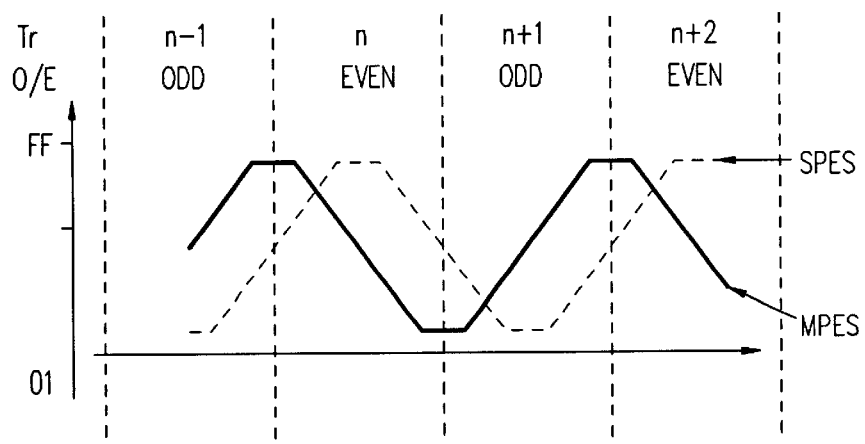
FIG. 7 is a diagram showing a table used for the computation of the position error signal of the head in the disk drive according to the embodiment of the present invention.
FIG. 8 is a diagram showing the position in the track width direction and a change in the position error signal of the head in the disk drive according to the embodiment of the present invention.
Figure 9:
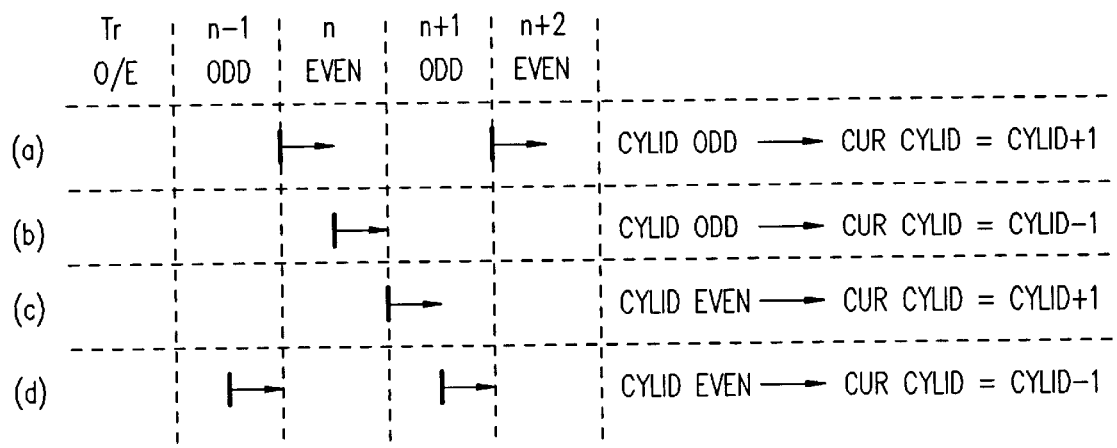
FIG. 9 is a diagram showing the relationship between the position of the head in the track width direction and an computation equation used to compute a cylinder ID number.
Figure 10:
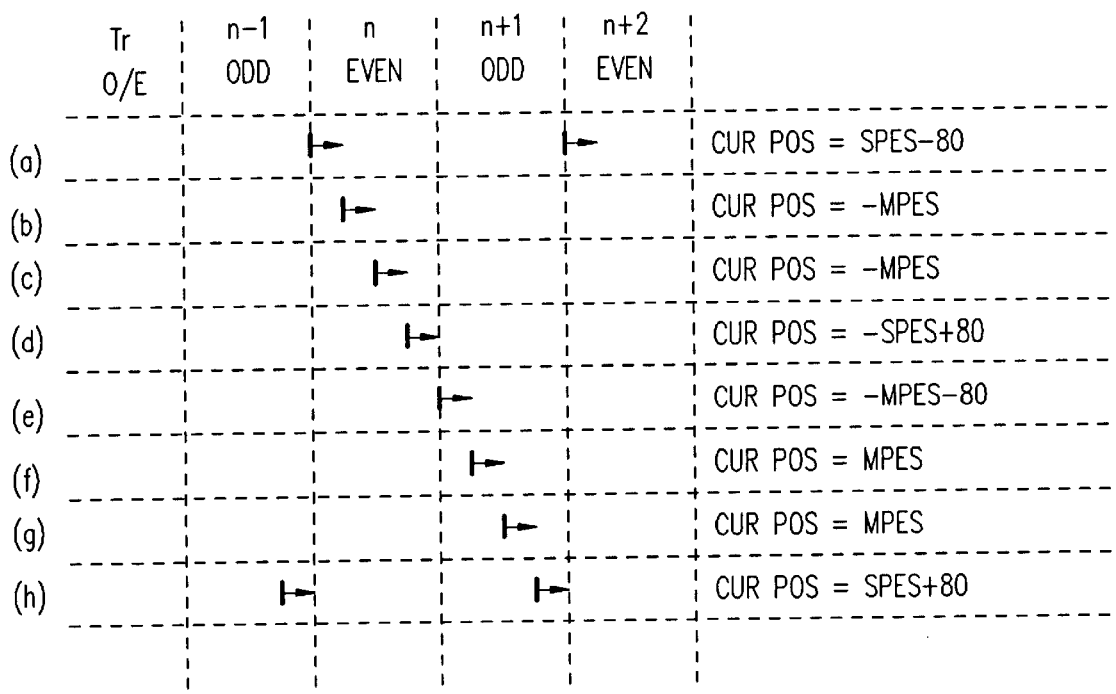
FIG. 10 is a diagram showing the relationship between the position of the head in the track width direction and an computation equation used to compute the current position.
Figure 11:
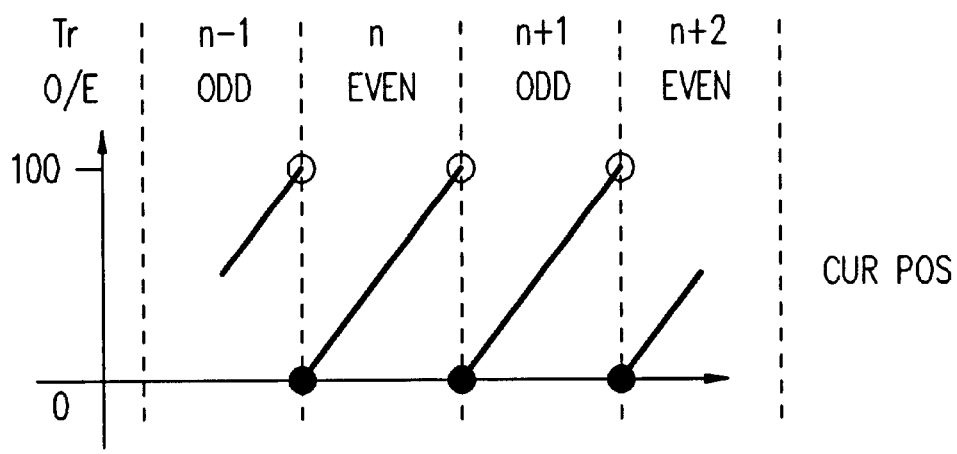
FIG. 11 is a diagram showing the position of the head in the track width direction and a change in the current position.

The changes of the MPES and SPES with respect to the position of the head 2 in the radial direction of the magnetic disk 1 become as shown in FIG. 8. The current cylinder CUR_CYL which is computed by a table shown in FIG. 7 becomes as shown in FIG. 9. Also, an equation for computing the current in-track position CUR_POS becomes as shown in FIG. 10 with respect to the position of the head 2 in the radial direction of the magnetic disk 1, and the current in-track position CUR_POS which is computed by this equation becomes as shown in FIG. 11. The SA 23 adds the current cylinder CUR_CYL and the current in-track position CUR_POS computed in this way and defines it as the current track CUR_TRK.

Furthermore, the SA 23 defines as a target track (TAR_TRK) a track over which the head 2 is desired to be held, and as described below, parameters, such as the track distance (DST) between this target track and the current track CUR_TRK, deviation (CPE), the sum of deviations (SPE to be described later) of a plurality of servo patterns (when regenerated), and the deviation difference (speed CVE) between servo patterns, are computed.

Figure 12:
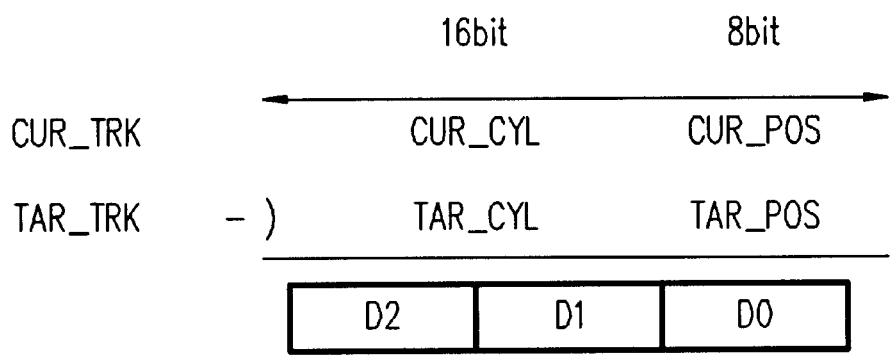
FIG. 12 is a diagram showing computation of track distance.

The current track CUR_TRK, as shown in FIG. 12, consists of a 16-bit CUR_CYL representing the current cylinder ID number CYLID and an 8-bit CUR_POS representing the current in-track position. Similarly, the target track TAR_TRK consists of a 16-bit TAR_CYL representing a target cylinder ID number CYLID and an 8-bit TAR_POS representing a target in-track position. Therefore, as shown in FIG. 12, the difference between the current track CUR_TRK and the target track TAR_TRK is 24 bits (D0, D1, and D2).

The SA 23 takes the absolute value of higher 16 bits (D2 and D1) of the difference between the current track and a target track, that is, the difference between the current track number (CYLID) and a target track number (CYLID) to be a track distance DST. The SA 23 also takes lower 16 bits (D1 and D0) of the difference between the current track and a target track (that is, lower 8 bits of the difference between the current track number (CYLID) and a target track number (CYLID) and lower 8 bits of the difference between the in-track positions) to be deviation CPE. The value area of the deviation CPE is between 8000h and 7FFFh. In addition, the SA 23 regards the absolute value of the deviation CPE as an absolute deviation APE.

The track distance DST, deviation CPE, and absolute deviation APE are computed by the SA 23 each time each servo pattern is regenerated. Also, the SA 23 retains at least deviation CPE, and when a plurality of servo patterns are regenerated, the SA 23 computes the sum of deviations (deviation sum) SPE and the deviation difference (speed) CVE between servo patterns.

Furthermore, the SA 23 computes the absolute value (absolute speed) AVE of the speed CVE.

Figure 13:
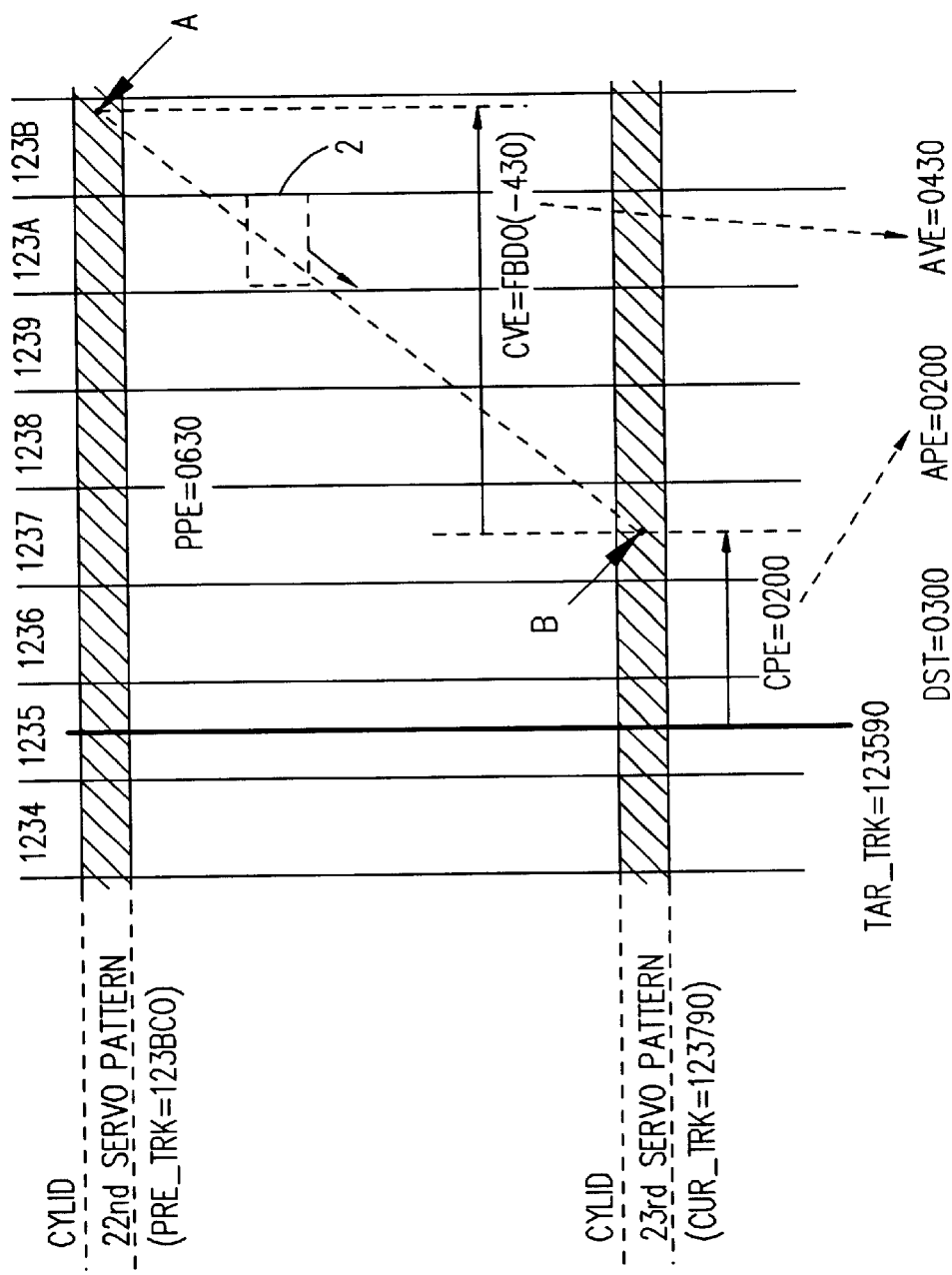
FIG. 13 is a diagram showing computation of head speed.

A description will be made of the case where the head 2 arrives from the position A on the 22nd servo pattern at the position B on the 23rd servo pattern, on the way to track 1235h where the head 2 moves, as shown for example in FIG. 13. When the head 2 is at position B, the track distance DST is 0003h. Also, when the head 2 is at position B, the deviation CPE is 0200. The previous deviation CPE (PPE), that is, the deviation CPE when the head 2 is at position A is 0630h. Therefore, the absolute deviation APE becomes 0200h. Also, the speed CVE is the difference between these deviations, 0200h−0630h=FDD0h, that is, −430h. Therefore, the absolute speed AVE becomes 0430h.

If parameters are computed as described above, the SA 23 will perform selection of an operating mode, deviation prediction, a write abort process, a cylinder ID estimation process, and a position deviation sum (SPE) computation process, based on these parameters. These processes will hereinafter be described.

Figure 14:
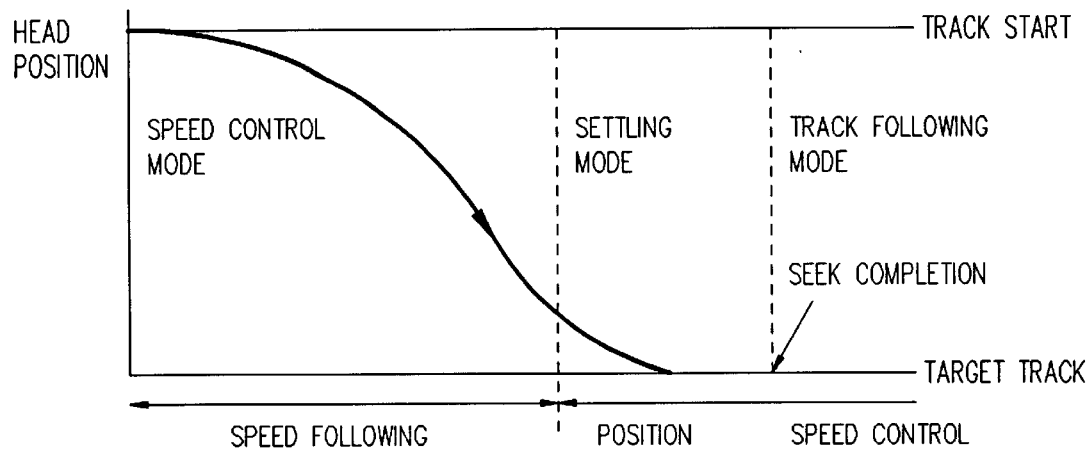
FIG. 14 is a diagram showing operating modes used during a seek operation.

The selection of an operating mode is described as follows. There is usually a need to optimize control in correspondence with the deviation (CPE, APE) between the position of the head 2 and the position of a target track and the aforementioned speed (CVE, AVE). More specifically, as shown in FIG. 14, when a target track is specified, a control for accelerating the head 2 toward the target sector is first executed. Then, if the moving speed of the head 2 reaches a predetermined speed, a control for moving the head 2 at a constant speed will be executed. The two control modes in which the head 2 is moved at an accelerating speed and a constant speed will hereinafter be referred to as a speed control mode. Next, if the head 2 arrives near the target sector, a control for decelerating the head 2 will be executed. This control will hereinafter be referred to as a settling mode. Finally, if the head 2 arrives at the target track, a following control for causing the head 2 to follow the target track will be executed. This control will hereinafter be referred to as a track following mode.

In this disk drive, the value areas of the absolute deviation APE and absolute speed AVE are segmented into some ranges, and it is judged which mode is selected by which range the aforementioned computed absolute deviation APE and absolute speed AVE belong to. The SA 23 performs the control of feedback value with respect to the VCM driver section 6 in correspondence with a selected mode. For example, in the aforementioned speed control mode the feedback value is gradually increased, and in the settling mode the feedback value is gradually decreased.

In addition, the SA 23 aborts read and write operations in the case where either one or the other of the aforementioned computed absolute deviation and speed ranges exceeds a predetermined reference. If an abort process such as this is performed, the read and write operations with respect to a wrong track can be prevented.

The deviation prediction and write abort process is described as follows. In the aforementioned abort process, read and write operations have been aborted based on the current deviation and speed, but particularly during a write operation, the position of the head 2 at the time of the regeneration of the next servo pattern is predicted and then a write abort operation is performed. More specifically, the SA 23 predicts the position deviation at the next servo pattern from the absolute value of CPE+CVE and then performs a write abort operation in the case where the absolute value of the predicted value is not within a certain reference value (PWAC). To the reference value PWAC, an appropriate value is set in anticipation of a feedback control having been performed on the VCM driver section 6 as a result of the computation at the current servo pattern and in anticipation of the head position having been corrected.

The cylinder ID estimation process is described as follows. As previously described, a cylinder ID number (CYLID) is obtained if the gray number code in a servo pattern is regenerated. However, in the case where the head 2 is moving at a high speed, there are cases where even a gray number code contains a read error. In such a case, if the gray number code is simply processed as an error, the control of the head position will no longer be able to be performed until the next servo pattern is regenerated. For this reason, when the cylinder ID number of a certain adjacent servo pattern is obtained, the SA 23 computes an intercylinder speed (IVE) from the difference between cylinder ID numbers. When the intercylinder speed IVEn becomes greater than a previously prescribed reference speed AVC (which is prescribed based on the speed of the head 2 at which the probability of gray code read error occurrence becomes high), the SA 23 will judge that a gray code read error has occurred. Also, the SA 23 estimates a cylinder ID number and employs this cylinder ID number, thereby continuing the servo control thereafter. Therefore, even if a cylinder ID read error occurred temporarily, the servo control could be continued, and this can contribute to an increase in the speed of the seek operation.

The process of computing the sum (SPE) of position deviations will be described next. In order to determine the servo data for driving the VCM driver section 6, the position deviation sum (SPE) at the time of the regeneration of the previous servo patterns is employed. The SA 23 sets an initial value to this SPE at a certain point of time (for example, when a specific servo pattern is regenerated) and adds deviation CPE to it for each servo pattern thereafter.

After the aforementioned processes have been executed, the SA 23 computes the servo data (CNTIN) for controlling the VCM driver section 6. This servo data CNTIN is computed, for example, according to the following equation, as the sum of deviation CPE, speed CVE, deviation sum SPE, and calculated values being obtained at the time of the regeneration of the previous servo pattern, multiplied by appropriate coefficients.

Equation 4

$$CNTIN = U + CENT \quad (4)$$

$$U = K0\ CPE + K1\ CVE + K2\ SPE + K3\ U1 + K4\ U2$$

$$U2 = U1$$

$$U1 = -U$$

where K0, K1, K2, K3, K4, and CENT are correction coefficients.

The SA 23 performs a filter process on the servo data CNTIN computed in the aforementioned way, and computes the data DACOUT which is fed back to the VCM driver section 6. The computer data DACOUT is supplied to the SIO 22. The SIO 22 supplies the data DACOUT from the SA 23 to the DAC section of the VCM driver section 6, as serial-data. Based on the supplied data (DACOUT), the DAC section of the VCM driver section 6 drives a voice coil motor (VCM), thereby controlling the position of the head 2.

Figure 15:
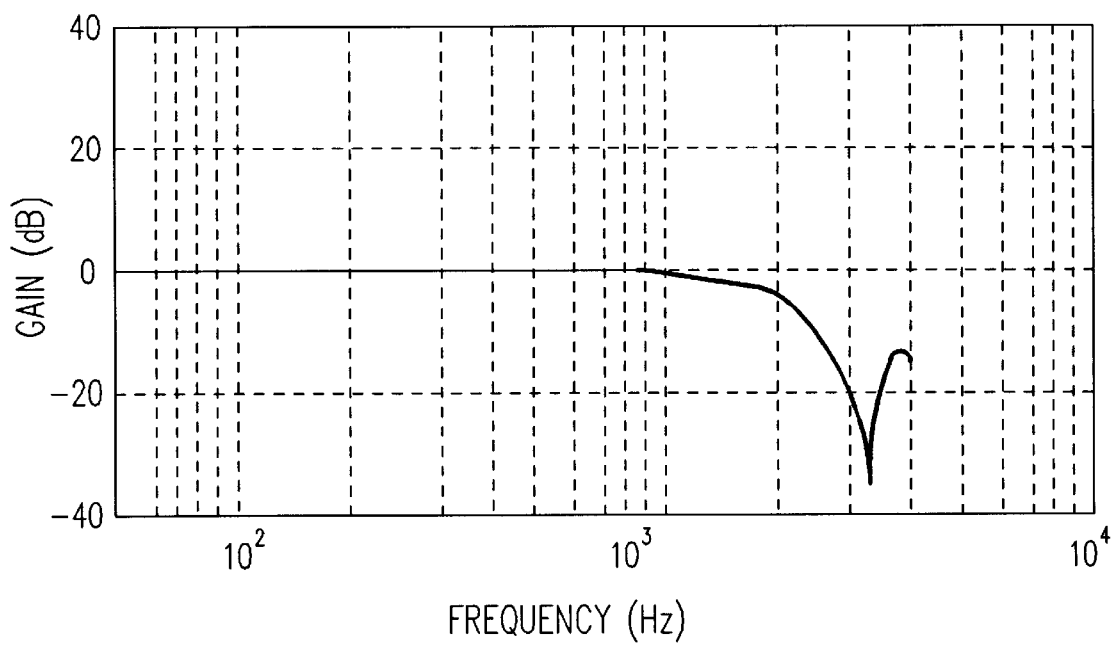
FIG. 15 is a diagram showing a filter characteristic which sets a band limit to servo output.

Incidentally, when the VCM is driven without setting any band limit to the servo data CNTIN obtained in the aforementioned way, there are cases where problems will be caused. For example, in FIG. 1 the actuator system comprising the head arm 3 has a mechanical resonance frequency component. When the servo data (CNTIN), as it is, is supplied to the VCM as data DACOUT, there are cases where the actuator system will resonate due to the resonance frequency component. For this reason, for example, as shown in FIG. 15, there is generally employed a characteristic notch filter whose gain becomes minimum at a frequency of 3.2 kHz, and the resonance frequency component is reduced.

Figure 16:
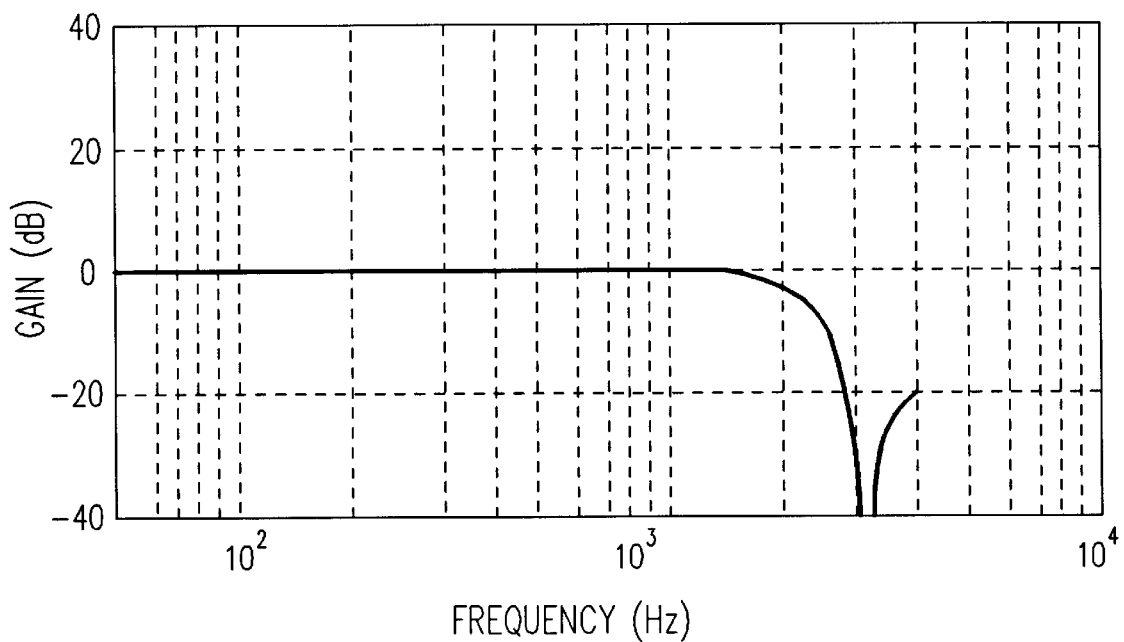
FIG. 16 is a diagram showing another filter characteristic which sets a band limit to servo output.
Figure 17:
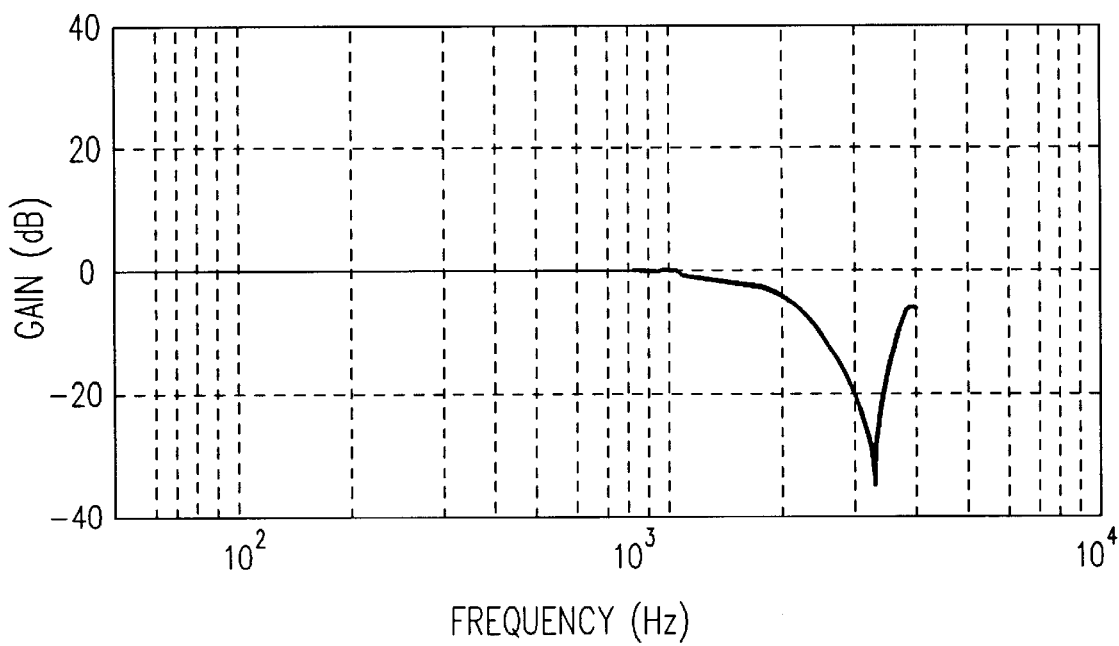
FIG. 17 is a diagram showing still another filter characteristic which sets a band limit to servo output.

In addition, during a seek operation, in the speed control mode a synthesized characteristic filter such as that shown in FIG. 16 is employed. The synthesized filter consists of the notch filter of FIG. 15 and a low-pass filter (LPF) with a cut-off frequency of 2 kHz. Also, in the settling mode the notch filter shown in FIG. 15 is employed, and in the aforementioned track following mode a characteristic filter such as the one shown in FIG. 17 is employed. The synthesized characteristic filter consists of a notch filter and a peak filter whose gain becomes maximum at the fundamental rotational frequency of a disk (for example, 120 Hz in the case of 7200 rpm).

In the speed control mode, the head arm 3 is moved comparatively faster and therefore a high frequency component is increased. In order to reduce the sound in an audio band which is increased by the increased high-frequency component, a synthesized characteristic filter consisting of a notch filter and a low-pass filter is employed.

In the settling mode, if a low-pass filter is employed, phase will delay, so a low-pass filter is not employed, but rather a notch filter is employed.

In the track following mode, if a low-pass filter is employed, phase will delay, so likewise a low-pass filter is not employed, but if a low-pass characteristic is flat, there will be cases where control will not stabilize due to disk eccentricity and disturbance. Therefore, a synthesized characteristic filter consisting of a notch filter and a peak filter is employed.

The previously described filter process is implemented by the SA 23. The switching of the filter characteristics can be performed by changing the coefficients of computation by the SA 23. The filter process by the SA 23 is equivalent to a digital filter having a two-stage structure shown in FIG. 18. This filter comprises two stages of filters connected in series: the front stage is a second filter and the rear stage is a first filter. The filter of the first stage has delay coefficients (delay means) u11 and u12 for delaying a digital signal by some desired amount of time (for example, a regeneration interval of servo patterns) and filter coefficients a0, a1, a2, b1, and b2. Likewise, the filter of the second stage has delay coefficients u21 and u22 and filter coefficients c0, c1, c2, d1, and d2. These coefficients can be written to or read from the MPU 12 (coefficient setting means) through the SRAM 24 and registers W0 through W4 shown in FIG. 4, for example.

Figure 19:
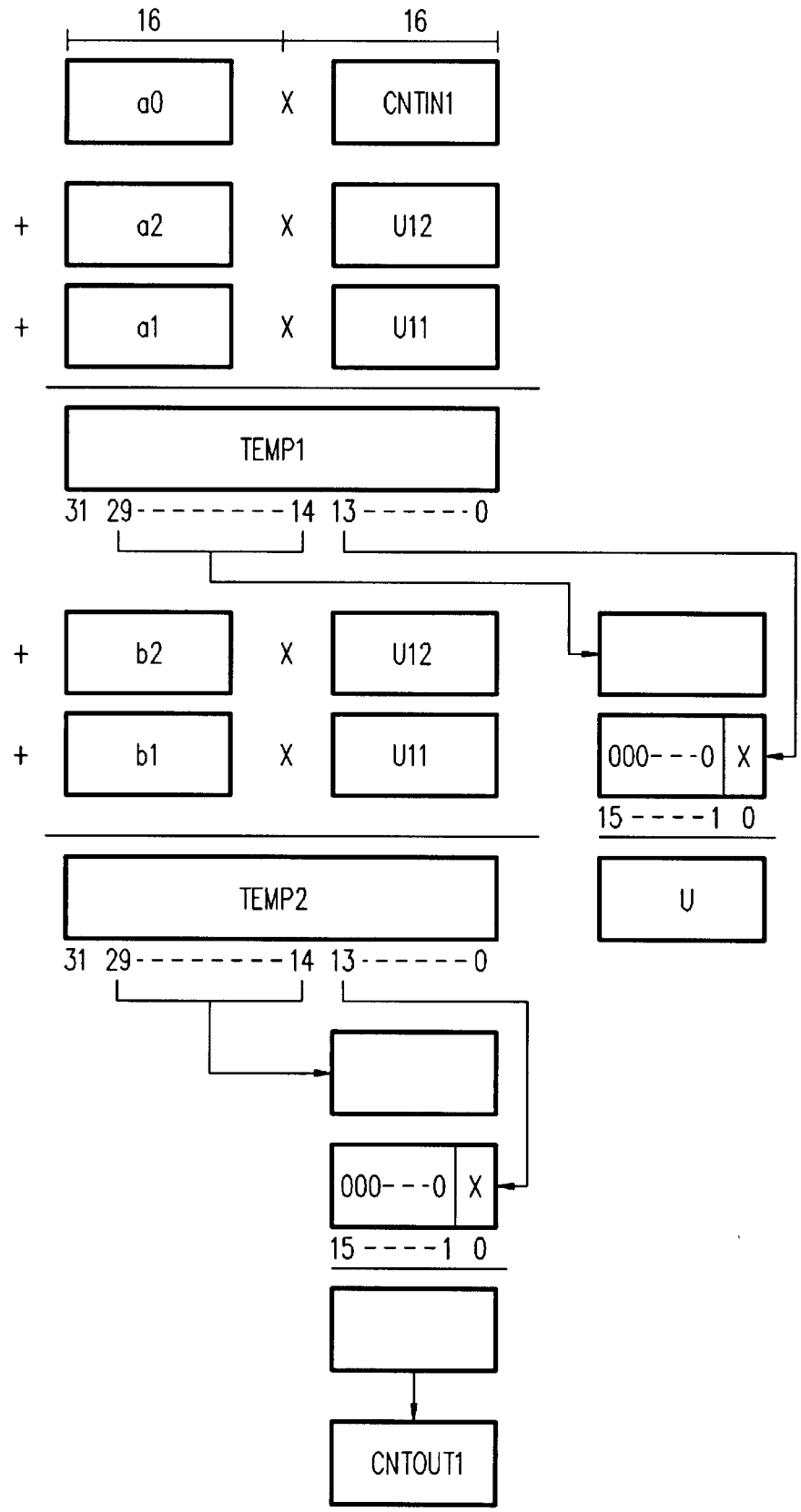
FIG. 19 is a block diagram showing a specific computation which is performed in the filter process by the SA.

The specific computation within the SA 23 is executed, for example, as shown in FIG. 19. If servo data CNTIN is input, TEMP1, u, and TEMP2 will be computed according to the following Equations 5, 6, and 7.

Equation 5

$$TEMP1[0:31] = a0[0:15]CNTIN[0:15] + a1[0:15]u11[0:15] + a2[0:15]u12[0:15] \quad (5)$$

where CNTIN[0:15], for example, means the first through the fifteenth bits of CNTIN.
Equation 6

$$u[0:15]=TEMP1[14:29]+TEMP1[13] \quad (6)$$

$$TEMP2[0:31]=TEMP1[0:31]+b1[0:15]u11[0:15]+b2[0:15]u12[0:15] \quad (7)$$

Thereafter, the output value CNTOUT1 of the first stage filter is computed according to the following Equation 8.
Equation 7

$$CNTOUT1[0:15]=TEMP2[14:29]+TEMP2[13] \quad (8)$$

After the CNTOUT has been obtained, the interior variables of the SA 23 (which are retained in RAM 24), that is, the values of the delay coefficients u12 and u11 are set as follows:
Equation 8

$$u12[0:15]=u11[0:15] \quad (9)$$

$$u11[0:15]=u[0:15] \quad (10)$$

With this operation, the interior variables of the SA 23 function as delay means.

The switching of the aforementioned filter characteristics can be realized by switching the filter of the second stage to a low-pass filter characteristic, a pass through characteristic, or a peak filter characteristic according to an operating mode, while the filter of the first stage remains fixed to a notch filter characteristic.

More specifically, the coefficient values corresponding to the operating modes are retained as a table, and they are overwritten according to each operating mode.

Figure 20:
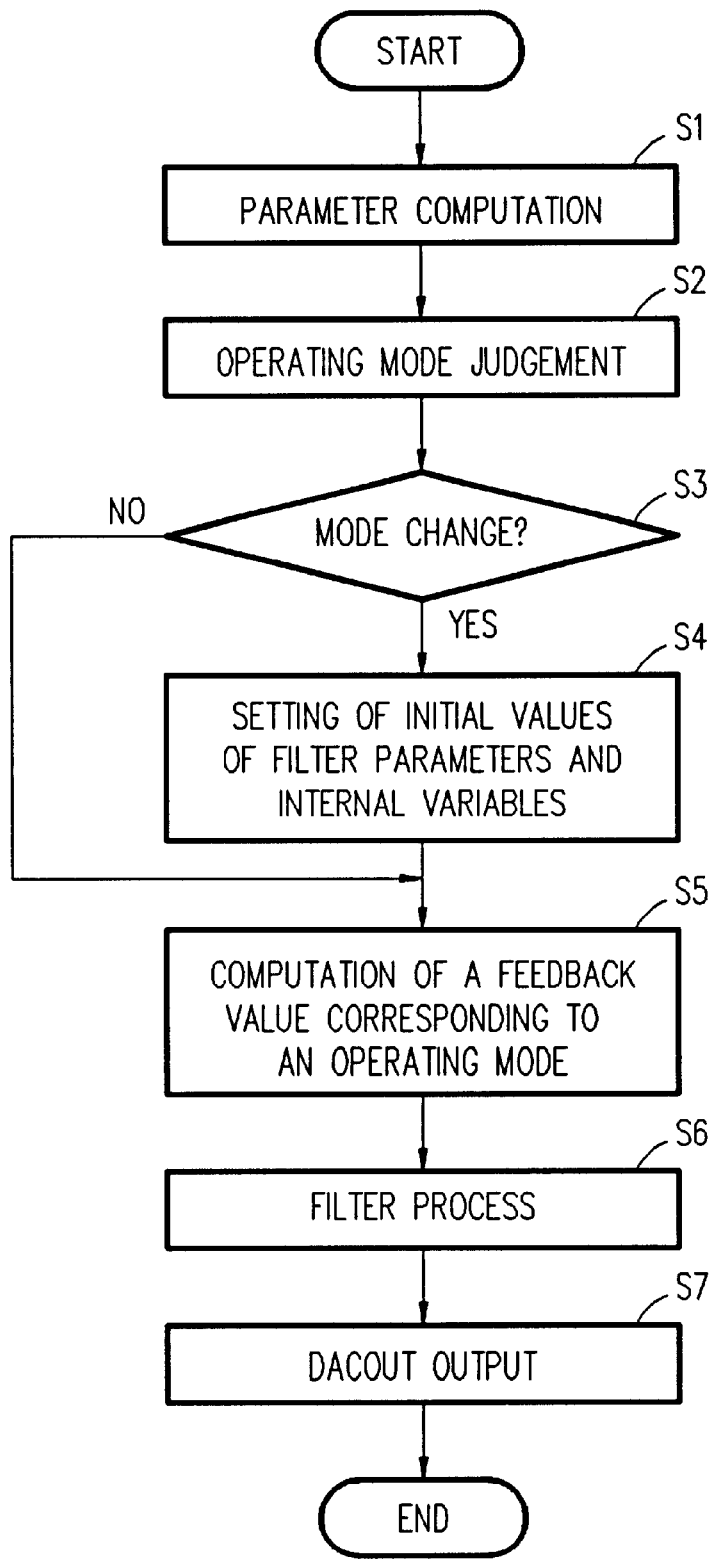
FIG. 20 is a flowchart showing a process of switching a filter characteristic.

FIG. 20 is a flowchart showing a process for switching the aforementioned filter characteristics. The process shown in FIG. 20 is carried out, each time a servo sector is regenerated and servo data is computed as previously described.

First, if there is servo interruption, the state machine 29 of the SA 23 will advance to step S1. In step S1 the aforementioned parameters (PES, position deviation CPE, speed CVE, absolute speed AVE, and position deviation sum SPE) are computed as described above. In step S2 an operating mode is judged based on the computed parameters.

In step S3 the state machine 29 compares the previous mode retained in the interior variables with the current mode and judges whether or not mode has been changed. If mode has not been changed, the state machine 29 will advance to step S5. If it has been changed, the state machine 29 will advance to step S4. In step S4, after the parameters of the filter characteristics (c0 through c2 and d1 through d2 of the filter of the second stage in FIG. 18) have been set for each operating mode previously recorded on a table, the initial values of interior variables (i.e., the values of the delay variables u21 and u22 of the second stage filter) are set.

Figure 18:
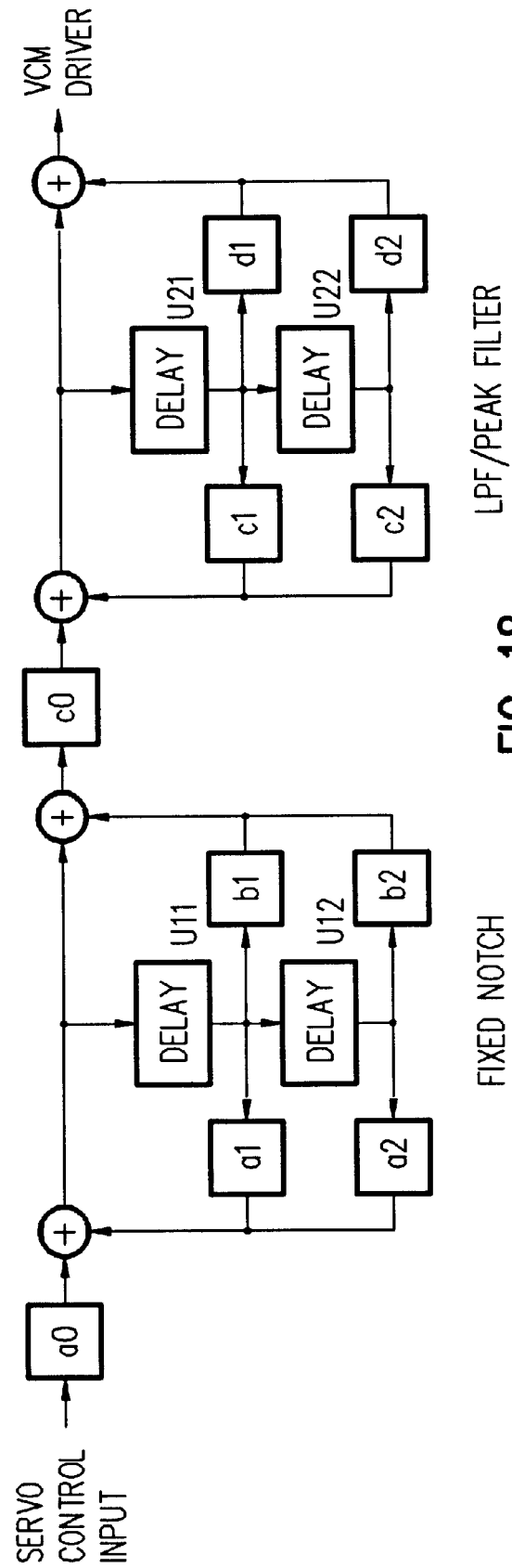
FIG. 18 is a conceptual block diagram showing how a filter process is executed by the SA.

In the case where a filter characteristic is switched (particularly in the case where a low-pass filter characteristic is changed to a peak filter characteristic), the filter coefficients c0 through c2, d1, and d2 of the digital filter shown in FIG. 18 will change abruptly. Therefore, in the case where the previous interior variables (i.e., the delay values of delay variable u21 and u22) are employed as they are, filter outputs will be discontinuous.

The discontinuation in the filter outputs is caused by the direct current (DC) component and alternating current (AC) component of the filter output. First, attention is given to the DC component.

Since the gain with respect to the DC component of the filter of the second stage in FIG. 18, for example, is $c0/(1-c1-c2)$, the control output during filter switching and a value of Uss are computed, and based on these, the values of u21 and u22 are set. The value of Uss is computed by multiplying the gain $(c0/(1-c1-c2))$ by an estimated value Css.
Equation 9

$$Uss = Css\frac{c0}{1-c1-c2} \quad (11)$$

The control output during filter switching and the estimated value Css can be computed by the integrated control value in the aforementioned servo control (equivalent to the aforementioned position deviation sum SPE). Generally, in the actuator system of a disk drive, feedback data is corrected in correspondence with the head position in the radial direction of the disk. It is general that such correction is made based on servo data or an integrated value of a filter input. Therefore, such values can be employed as integrated control values.

In step S5 the state machine 29 computes servo data CNTIN in the above described way, and in step S6 the filter process expressed by FIG. 18 is executed. Note that the filter characteristics and the initial values of the interior variables have been set in step S4. The feedback data DACOUT obtained by this filter process is supplied to the VCM driver section 6 through the SIO 22.

If the process shown in FIG. 20 is carried out, the switching of the filter characteristics can be performed in correspondence with an operating mode and the initial values of the interior variables can be set.

Figure 21:
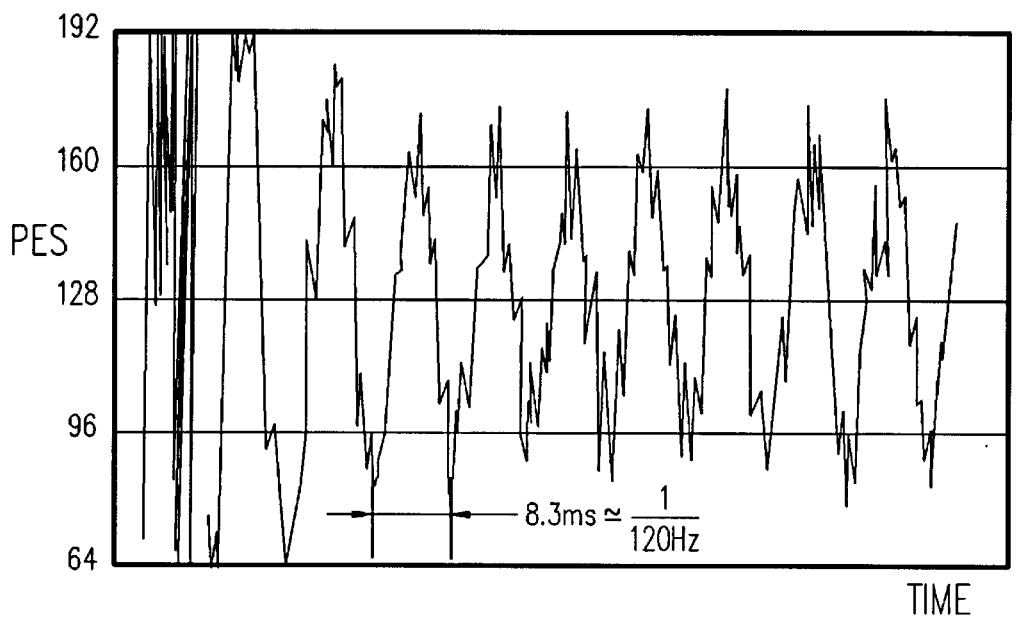
FIG. 21 is a diagram showing the error of the head position in the case where a conventional filter was employed.

FIG. 21 is a diagram showing the error (PES) of the head position in the case where a seek operation is performed on 1000 tracks with a conventional filter. In the figure, the center of a target track is at a PES of 128, and the width of one track will be 256 if it is expressed by PES. Generally, because of the error (eccentricity) in the attaching operation of the magnetic disk 1, the radial position of the track fluctuates upon rotation of the magnetic disk 1. For this reason, if the head cannot follow the fluctuation in the track position, PES will fluctuate periodically. For example, in the case where the number of revolutions of the magnetic disk 1 is 7200 rpm, PES has a cycle of 120 Hz as shown in FIG. 21.

Figure 22:
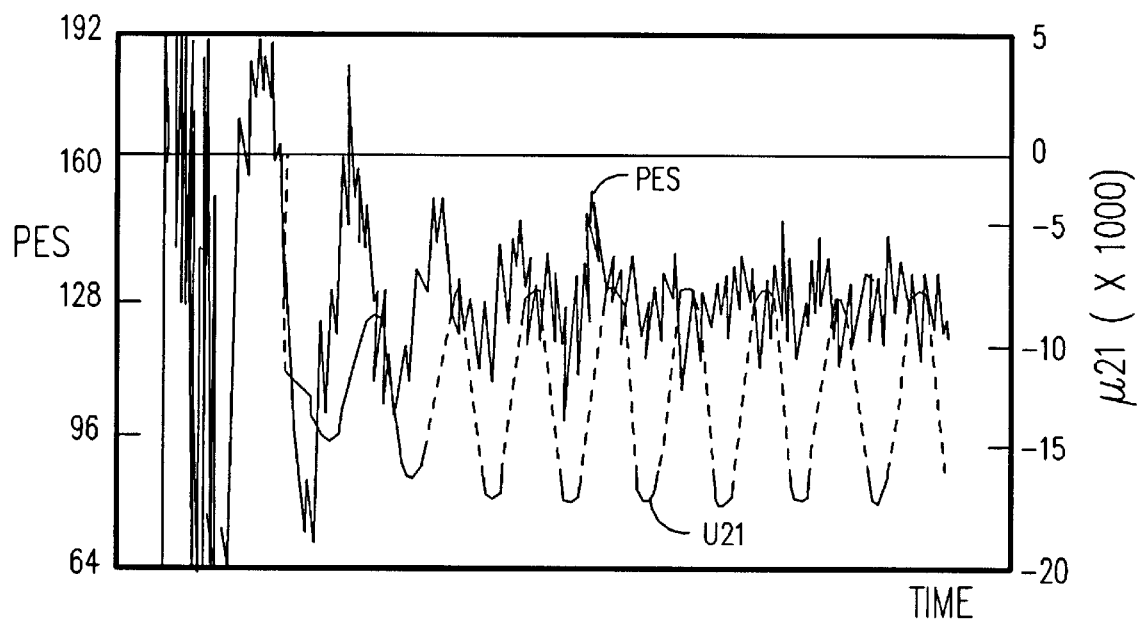
FIG. 22 is a diagram showing the error of the head position in the case of the disk drive according to an embodiment of the present invention.

On the other hand, in the case where a filter characteristic is switched in the aforementioned way in correspondence with an operating mode and also the initial values of the interior variables are set by the integrated control values based on the Equation 11, the PES in the case of a similar seek operation as FIG. 21 becomes as shown in FIG. 22. In FIG. 22 the value of the interior variable u21 is indicated by a broken line. In the case shown in FIG. 22, after 2 to 3 cycles after a seek operation, the amplitude of PES is reduced by the peak filter effect. More specifically, the stability in the servo control is enhanced and the followability of the head 2 is improved.

If a filter characteristic is switched in the aforementioned way in correspondence with an operating mode, a suitable servo characteristic for each operating mode can be easily realized. Also, if appropriate initial values are set to the interior variables of the filter when the filter characteristic is switched as described above, filter outputs can be prevented from being discontinuous when the filter characteristic is switched.

In addition, in background art, the filter process is realized by a filter circuit and a DSP or MPU is provided separately from the MPU 12 which implements management of data input and output between it and external equipment, so the overall cost of the disk drive is increased.

On the other hand, in the disk drive of the present invention, the filter characteristic is switched only by changing an arithmetic parameter with the SA 23, as described above, and there is no need to provide a plurality of filter circuits as in the conventional disk drive. For this reason, cost reduction is achievable.

In addition, in the disk drive of the present invention, the filter process can be performed independently of the MPU 12 by the SA 23, so there is almost no increase in the processing load to the MPU 12.

The radial track displacement caused upon rotation of the magnetic disk 1, incidentally, is independent on the track position and constant for each magnetic disk 1. For this reason, as disclosed in U.S. Pat. No. 5,608,586, the track position displacement is recorded in correspondence with the rotational angle of the magnetic disk 1 on a table, whereby the initial values of the aforementioned filter interior variables can be set.

Figure 23:
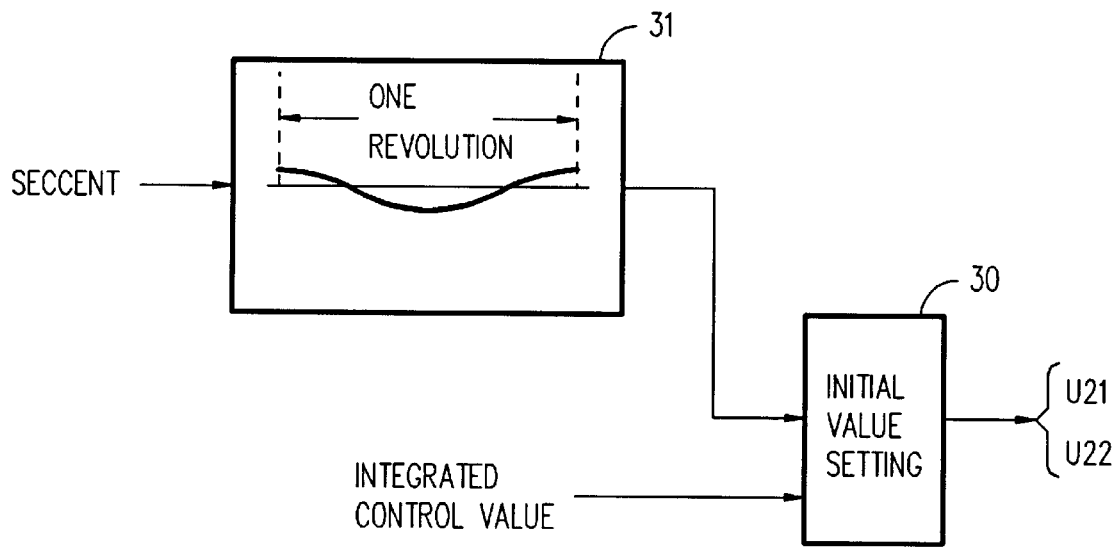
FIG. 23 is a conceptual diagram showing a process for executing correction of an initial value of a filter in correspondence with the rotational angle of a magnetic disk.

FIG. 23 conceptually shows the structure of the SA 23 for performing the previously described control. That is, the SA 23, in addition to the structure previously described, is equipped with an initial value setting portion 30 which is controlled by the state machine 29 for executing the computation expressed by Equation 11 and a table 31 which shows the displacement of a track position corresponding to the rotational angle of the magnetic disk 1. Note that the table 31 is provided for each recording side of the magnetic disk 1.

As a value representing the rotational angle of the magnetic disk 1, the physical sector number (SECCNT), for example, coming from a servo sector is supplied to the table 31, and a correction value corresponding to this is supplied to the initial value setting portion 30.

If a correction value is supplied from the table 31, the initial value setting portion 30 will compute the Css in Equation 11, based on an integrated control value which is supplied in the same way as the aforementioned and on the supplied correction value, and will set the initial values of the filter interior variables u21 and u22. If initial values are set in this way, optimum initial values corresponding to the position in a rotational angle direction can be set.

Figure 24:
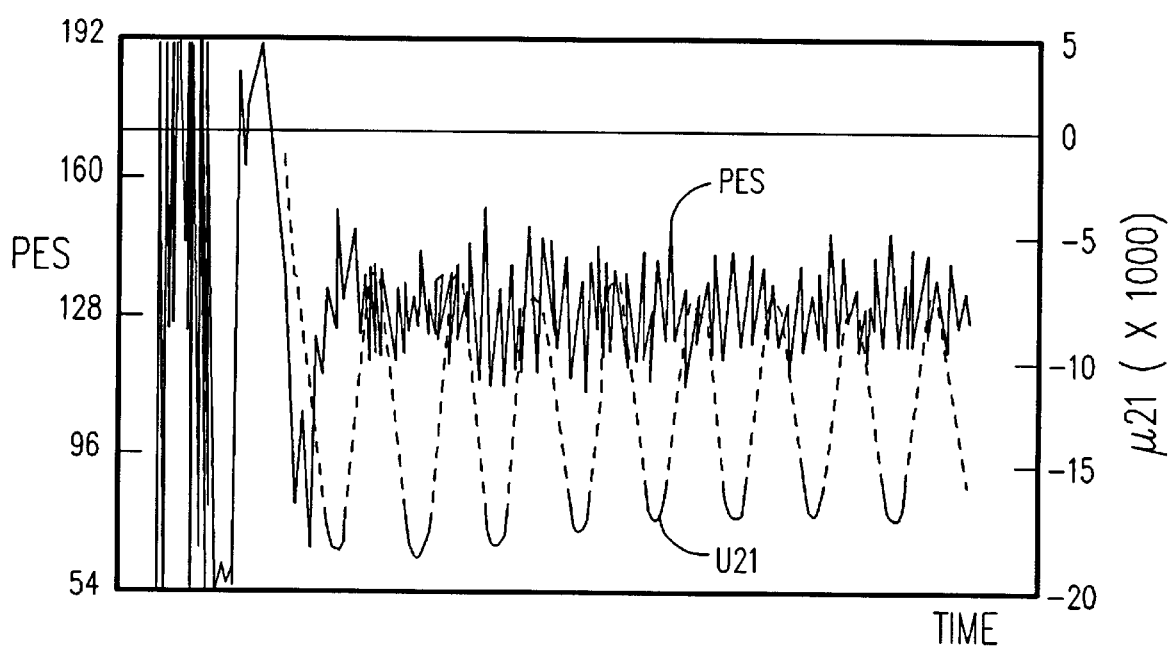
FIG. 24 is a diagram showing the error of the head position in the case of the disk drive according to another embodiment of the present invention.

FIG. 24 shows the PES in the case where the setting of the initial values was performed and where a similar seek operation as FIG. 21 was performed. In FIG. 24, as with FIG. 22, the value of the interior variable u21 is shown by a broken line. In this case, the amplitude of the PES is reduced immediately after a seek operation by the peak filter effect. Therefore, the stability of the servo control is more enhanced than in the case where the initial values of the filter interior variables were set only by an integrated control value.

In the above description, while a filter characteristic has been switched in correspondence with an operating mode during a seek operation, a peak filter may be set as a part of the error recovery process.

One of the error occurrence causes is the instability in a track following operation due to disturbance. In the case of a cause such as this, there are cases where a normal read operation can be performed by employing a peak filter or changing a peak filter characteristic.

In order to realize a process such as this, the MPU 12 prepares sets of filter coefficients as a first table and selects one set from the first table in correspondence with an operating state. The selected set of filter coefficients are retained in a second table which is employed in step S4 of FIG. 20.

Figure 25:
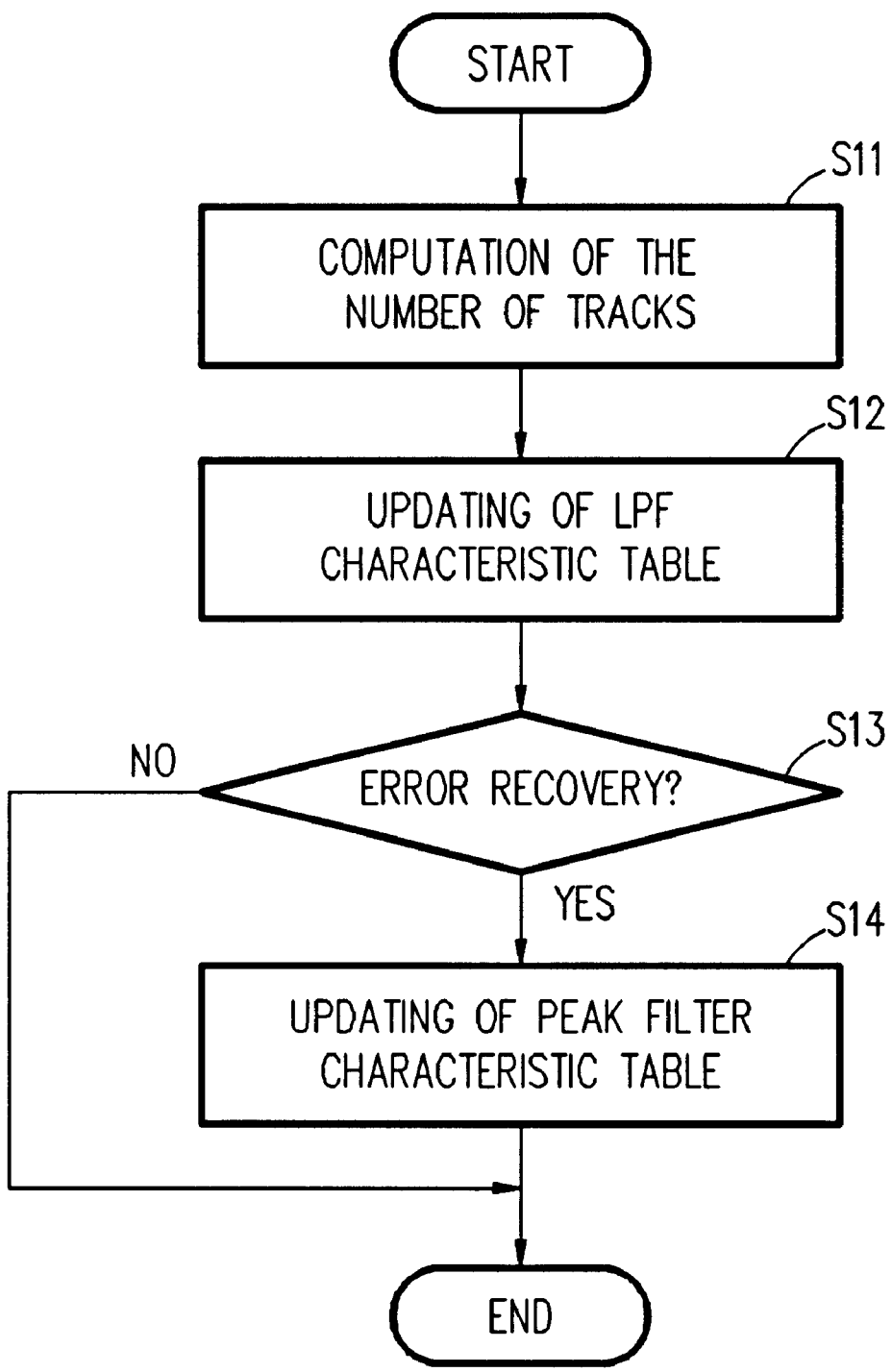
FIG. 25 is a flowchart showing an error process.

More specifically, the MPU 12 implements a process such as that shown in FIG. 25 at intervals of a predetermined time and advances to step S11.

In step S11 the MPU 12 detects the number of tracks from the difference between a target track number and the current track number. In step S12 the characteristic of the low-pass filter is selected in correspondence with the detected number of tracks. After the selected characteristic has been retained in the table employed in step S4, step S12 advances to step S13. For example, in the case where the detected number of tracks is great, the cut-off frequency of the low-pass filter is made low in order to reduce sound during a seek operation. Conversely, in the case where the detected number of tracks is small, the cut-off frequency is made high. Some characteristics such as these are previously obtained and retained in the first table. In correspondence with the detected number of tracks, one characteristic is selected from the characteristics retained in the first table and is retained in the second table employed in step S4.

In step S13 the MPU 12 detects whether or not an error recovery process is now in process of execution. If it is not in process of execution, the MPU 12 will end the process shown in FIG. 25. If the error recovery process is in process of execution, the MPU 12 will advance to step S14. In step S14 a filter characteristic for the error recovery process is selected and retained in the second table employed in step S4. After the filter characteristic has been retained, the MPU 12 ends the process shown in FIG. 25. Some filter characteristics such as these are obtained in correspondence with the number of retries of the error recovery process and are retained in the first table. In correspondence with the number of retries, a filter characteristic is selected from the retained filter characteristic and is retained in the second table employed in step S4.

Thus, if the filter characteristic in the table employed in step S4 is changed in correspondence with an operating state, a filter characteristic most suitable for an operating state can be selected. For example, a reduction in the sound during a seek operation and an enhancement in the reliability of error recovery are realizable.

In many cases, the supply of the control data DACOUT to the VCM driver section 6 is usually once for regeneration of one servo pattern. However, the cycle of servo patterns is anywhere between about 5 KHz and 10 KHz, and if servo patterns are left as they are, the sound developed by the vibration of the head arm 3 will be within a human audio frequency band and will be recognized as noise.

If an oversampling process for separately outputting the control data (DACOUT) of each servo pattern a plurality of times is performed, the sound developed by the vibration of the head arm 3 can be moved outside a human audio frequency band.

In this case, the process until the computation of the servo data CNTIN is executed once for each servo pattern by the SA 23. Then, the SA 23 executes the filter process and outputs the first control data DACOUT. Thereafter, the filter process for the second control data DACOUT is immediately performed. The SA 23 waits for a DACOUT request which is sent by a timer which measures a DACOUT interval. If the timer sends a DACOUT request, the SA 23 will output the control data DACOUT which has been obtained and will repeat a similar process a prescribed number of times. With this operation, control data DACOUT can be output at intervals of ¼ of the servo pattern interval.

Thus, if the output of the control data DACOUT is performed 4 times for each regeneration interval of a servo pattern (that is, quadruple oversampling), the first process which takes most time will need to end in ¼ of the regeneration interval of a servo pattern. For example, in the case where 80 servo patterns are present along the circumference of a data storage medium (magnetic disk 1) and the rotational speed of the data storage medium is 7200 rpm, a servo sector is regenerated at intervals of about 104 µs. Therefore, the first process needs to end in about 25 µs.

If the oversampling process is performed, the sound in an audio frequency band can be reduced even when the aforementioned low-pass filter is not always employed during a seek operation. Therefore, a processing load for a filtering process can be reduced. In addition, if the oversampling process is performed along with the low-pass filter, a further reduction in the sound in an audio frequency band can be realized.

In the digital filter according to the present invention, when the filter coefficient is set and changed by the coefficient setting means, the initial value setting means sets the output value of the delay means, whereby filter outputs can be prevented from being discontinuous when a filter characteristic is changed.

Therefore, if servo control is performed with the aforementioned filter, the optimization of each operating mode requiring a different servo characteristic can be easily performed.

What is claimed is:

1. A digital filter for use in setting a band limit in a servo control unit having servo arithmetic means for computing control output based on an external control input, band limiting means for setting a band limit to the control output computed by the servo arithmetic means, and mode selecting means for changing an operating mode between, at least, track seek, track settle, and track follow modes, based on the external control input, said digital filter comprising:

a first filter including means for delaying an external filter input by at least a unit time, filter coefficient setting means for setting a filter coefficient for said first filter in order to change a characteristic of said first filter, when the operating mode is changed by the mode selecting means, by weighting at least either one or the other of said external filter input and said delaying means, and means for computing a first filter output by adding at least two values for said external filter input, an output of said delaying means, and/or an output of said filter coefficient setting; and initial value setting means for setting an output of said delaying means, based on at least one of said external filter input and said first filter output before changing said filter coefficient, when said filter coefficient set by said filter coefficient setting means is changed, in order to minimize filter input discontinuity when the operating mode is changed.

2. The digital filter as set forth in claim 1, wherein said initial value setting means sets an output value of said delaying means, based on an integrated value for correcting said external filter input and on the gain of said first filter.

3. The digital filter as set forth in claim 1, wherein:
said external filter input has a fluctuation pattern having a predetermined cycle;
said initial value setting means is provided with means for retaining the fluctuation pattern of said external filter input and means for detecting a fluctuation phase of said external filter input; and
the output value of said delaying means is set based on a phase detected by said phase detecting means and the fluctuation pattern retained by said fluctuation pattern retaining means.

4. The digital filter as set forth in claim 1, wherein said first filter comprises two or more types of filters and wherein said coefficient setting means can switch said first filter to at least either a low-pass filter which passes a component less than a predetermined frequency or a peak filter which has a peak gain at a predetermined frequency.

5. The digital filter as set forth in claim 1, wherein said coefficient setting means can switch said first filter to at least either a filter for acoustic suppression or a filter for disturbance suppression.

6. The digital filter as set forth in claim 1, further comprising:
a first table for retaining a plurality of said filter coefficients; and
a second table for retaining a filter coefficient selected from said first table by an external input;
wherein said initial value setting means sets the filter coefficient of said first filter by employing one of the filter coefficients retained in said second table.

7. The digital filter as set forth in claim 1, further comprising:
a second filter which has a characteristic different from said first filter and sets a band limit to said external filter input and said first filter output.

8. The digital filter as set forth in claim 7, wherein said second filter comprises a notch filter which removes a predetermined frequency component from said external filter input or said first filter output.

9. A servo control unit comprising:
servo arithmetic means for computing control output based on an external control input; and
band limiting means for setting a band limit to the control output computed by said servo arithmetic means;
wherein said band limiting means further comprises:
a first filter including means for delaying an external filter input by at least a unit time, filter coefficient setting means for setting a filter coefficient by weighting at least either one or the other of said external filter input and said delaying means, and means for computing first filter output by adding at least two values for said external filter input, an output of said delaying means, and/or an output of said setting means; and
initial value setting means for setting the output of said delaying means, based on at least one of said external filter input and said first filter output before changing said filter coefficient, when said filter coefficient set by said filter coefficient setting means is changed in order to minimize filter input discontinuity.

10. The servo control unit as set forth in claim 9, further comprising:
mode selecting means for changing an operating mode, based on said external control input;
wherein said coefficient setting means changes the filter coefficient of said first filter when said operating mode is changed by said mode selecting means.

11. The servo control unit as set forth in claim 10, wherein said mode selecting means changes a characteristic of said servo arithmetic means in correspondence with said operating mode.

12. The servo control unit as set forth in claim 9, further comprising:
control means which performs at least an error recovery process on said control input and operates independently of said first filter and said coefficient setting means; and means for changing the filter coefficient set by said coefficient setting means, based on said error recovery process performed by said control means.

13. The servo control unit as set forth in claim 12, wherein at least said control means and said first filter are formed on the same semiconductor device.

14. The servo control unit as set forth in claim 9, further comprising:

seek distance detection means for detecting seek distance; and means for changing the filter coefficient set by said coefficient setting means, based on said seek distance detected by said seek distance detection means.

15. A disk drive comprising:

a disk-shaped storage medium having a servo area on which a servo sector is recorded and a data area on which a data sector is recorded;

recording/regeneration means for regenerating said servo sector and recording or regenerating said data sector on said disk-shaped storage medium;

drive means for controlling a position of said recording/regeneration means;

control means for at least performing input-output control of data with respect to external equipment or performing control of the recording or regeneration of said data sector which is performed by said recording/regeneration means;

position information extraction means for extracting position information representing a position of said recording/regeneration means from an output of said servo sector regenerated by said recording/regeneration means;

arithmetic means for computing servo data for driving said drive means, based on said position information extracted by said position information extraction means;

mode selecting means for changing an operating mode of the control means based on said servo data; and band limiting means for setting a band limit to said servo data computed by said arithmetic means;

wherein said band limiting means further comprises:

a first filter including means for delaying an external filter input by at least a unit time, filter coefficient setting means for setting a filter coefficient for said first filter, when the operating mode is changed by the mode selecting means, by weighting at least either one or the other of said external filter input and said delaying means, and means for computing filter output by adding at least two values for said external filter input, an output of said delaying means, and/or an output of said filter coefficient setting means; and initial value setting means for setting the output of said delaying means, based on at least one of said external filter input and said first filter output before changing said filter coefficient, when said filter coefficient set by said setting means is changed in order to minimize filter input discontinuity when the operating mode is changed.

16. The disk drive as set forth in claim 15, wherein said arithmetic means and said band limit setting means are provided separately from said control means.

17. A digital filter for use in a servo control unit of a disk storage device, the servo unit having a component for controlling the positioning of a head when reading and writing electronic data to and from a rotating disk, wherein the digital filter is used when controlling the head position while seeking an identified track of the disk (seek mode), while settling over the identified track (settle mode), and while following a track to identify a sector of the track (track follow mode), said digital filter comprising:

a front stage filter comprising a notch filter; and a rear stage filter comprising:

a delay structure for delaying an external filter input by at least a unit time, said external filter input including a track number and a sector number;

a filter coefficients setting apparatus for setting values for filter coefficients, wherein said filter coefficients change the characteristics of the rear stage filter so as to act at least like a low pass filter, a peak filter and/or no filter; and a delay coefficients setting apparatus for setting values for delay coefficients based on said external input and based on prior values for the filter coefficients such that discontinuity is minimized when switching between seek, settle and track follow modes.

* * * * *